(12) United States Patent
Paek et al.

(10) Patent No.: US 11,552,147 B2
(45) Date of Patent: Jan. 10, 2023

(54) BEZEL-LESS DISPLAY PANEL

(71) Applicant: LG Display Co., Ltd., Seoul (KR)

(72) Inventors: Seung Han Paek, Gyeonggi-do (KR);
Yu Cheol Yang, Gyeonggi-do (KR);
Seong Woo Park, Gyeonggi-do (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 17/394,201

(22) Filed: Aug. 4, 2021

(65) Prior Publication Data

US 2022/0093698 A1 Mar. 24, 2022

(30) Foreign Application Priority Data

Sep. 21, 2020 (KR) .................. 10-2020-0121388

(51) Int. Cl.
*H01L 27/32* (2006.01)
*G09G 3/3266* (2016.01)
*G09G 3/3233* (2016.01)
*G09G 3/3275* (2016.01)

(52) U.S. Cl.
CPC ......... *H01L 27/326* (2013.01); *G09G 3/3233* (2013.01); *G09G 3/3266* (2013.01); *G09G 3/3275* (2013.01); *G09G 2310/08* (2013.01)

(58) Field of Classification Search
CPC .................................................. H01L 27/326
USPC ............................................ 257/40; 345/206
See application file for complete search history.

(56) References Cited

U.S. PATENT DOCUMENTS

2020/0379595 A1* 12/2020 Kim ..................... G09G 3/03
2021/0091320 A1* 3/2021 Choi ................... G06F 1/1656

* cited by examiner

*Primary Examiner* — Long D Pham
(74) *Attorney, Agent, or Firm* — Fenwick & West LLP

(57) ABSTRACT

The present disclosure provides a display panel. The display panel may include a first substrate on which a main display area is disposed, at least one second substrate on which an auxiliary display area smaller than the main display area is disposed, and an organic film connecting the first substrate and the second substrate, wherein at least one second substrate includes a plurality of block substrates separated from each other, wherein the plurality of block substrates are connected by the organic film, and wherein each of the plurality of block substrates comprises pixels of the auxiliary display area.

20 Claims, 21 Drawing Sheets

FIG. 10
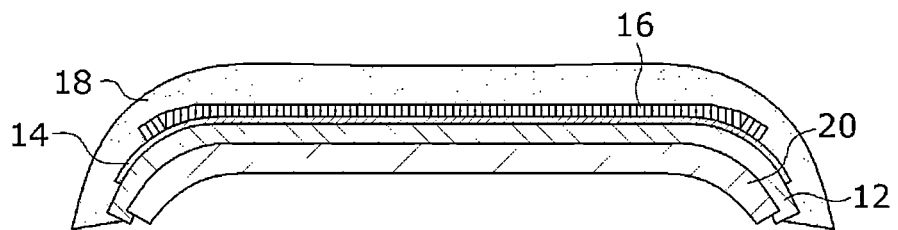
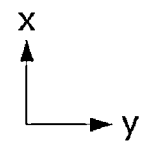
FIG. 11
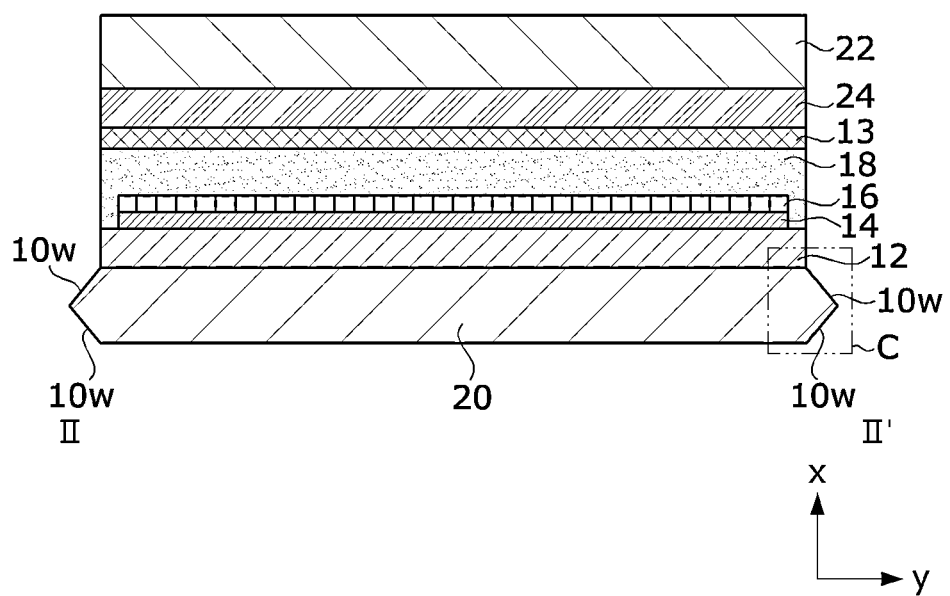
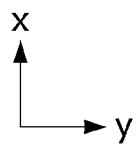

FIG. 14
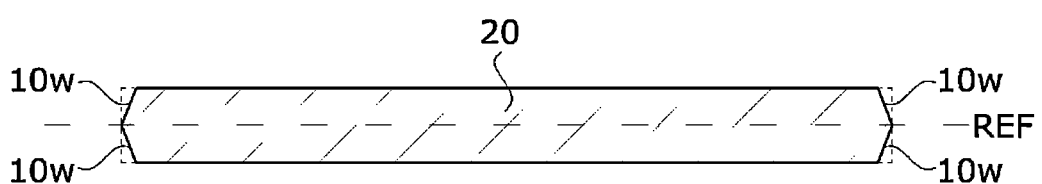
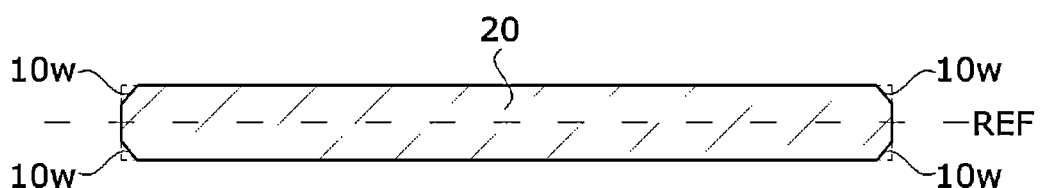
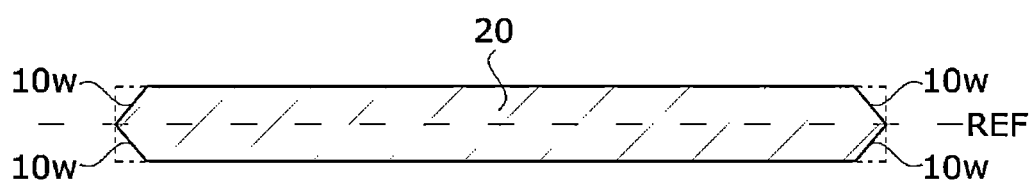
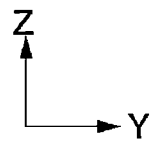

BEZEL-LESS DISPLAY PANEL

CROSS-REFERENCE TO RELATED APPLICATIONS

This application claims priority to and the benefit of Republic of Korea Patent Application No. 10-2020-0121388 filed on Sep. 21, 2020, the disclosure of which is incorporated herein by reference in its entirety.

BACKGROUND

1. Field

The present disclosure relates to a display panel. More particularly, the present disclosure relates to a display panel in which some or all of side surfaces and corners are implemented as a display area.

2. Discussion of Related Art

Electroluminescent display devices are roughly classified into inorganic light emitting display devices and organic light emitting display devices depending on the material of the emission layer. The organic light emitting display device of an active matrix type includes an organic light emitting diode (hereinafter, referred to as "OLED") that emits light by itself, and has an advantage in that the response speed is fast, the luminous efficiency and luminance are good, and the viewing angle is wide. In the organic light emitting display device, an organic light emitting diode (OLED) is formed in each pixel. The organic light emitting display device has a fast response speed, is excellent in terms of luminous efficiency, luminance and viewing angle, and provides an excellent contrast ratio and color reproducibility since it can express black gradations in complete black.

Recently, there are mobile terminals that use some of side surfaces and corners as a display area. This related art has a problem in that the resolution of the side display area is deteriorated and the color sense is different between the front display area and the side and corner display areas.

SUMMARY

An object of the present disclosure is to provide a display panel having improved image quality and color sense in side and corner display areas, and a display device including the same.

Another object of the present disclosure is to provide a bezel-less display panel and a display device including the same.

The problems to be solved in the embodiment are not limited thereto, and may also include the objects and effects that can be identified from the solutions or embodied forms of the problems described below.

In a display panel according to an embodiment of the disclosure, the display panel includes a first substrate on which a main display area is disposed, at least one second substrate on which an auxiliary display area smaller than the main display area is disposed, and an organic film connecting the first substrate and the second substrate, wherein at least one second substrate includes a plurality of block substrates separated from each other, wherein the plurality of block substrates are connected by the organic film, and wherein each of the plurality of block substrates comprises pixels of the auxiliary display area.

The at least one second substrate may include a first sub-substrate connected to a long side of the first substrate through the organic film, a second sub-substrate connected to a short side of the first substrate through the organic film, and a third sub-substrate connected to a corner portion where the long side and the short side of the first substrate meet. The first sub-substrate may include a plurality of first block substrates spaced apart in a direction going away from the first substrate. The second sub-substrate may include a plurality of second block substrates spaced apart in a direction going away from the first substrate. The third sub-substrate may include a plurality of third block substrates spaced apart in a shape of rings having a same center.

The plurality of third block substrates may be separated in a radial form.

The organic film may connect the plurality of first block substrates, the plurality of second block substrates, and the plurality of third block substrates.

The display panel may further comprise first pixels disposed on the first substrate and second pixels disposed on the at least one second substrate. Pixel density of the first pixels may be higher than that of the second pixels.

A pixels-per-inch (PPI) of the first substrate may be higher than that of the at least one second substrate.

When the first substrate and the plurality of third block substrates are on same plane, sizes of the plurality of third block substrates may increase as a distance from the first substrate increases.

When the first substrate and the plurality of third block substrates are on same plane, a gap between third block substrates adjacent to each other may increase as a distance from the first substrate increases.

A number of pixels disposed on the plurality of third block substrates may increase as a distance from the first substrate increases.

The display panel may further include a driving substrate, and a gate driving circuit disposed on the driving substrate. The driving substrate may be disposed adjacent to the first sub-substrate and the third sub-substrate, and be connected through the organic film.

The driving substrate may comprise a first driving substrate adjacent to the first sub-substrate, and a second driving substrate adjacent to the third sub-substrate, and the first driving substrate and the second driving substrate may be connected through the organic film.

The second driving substrates may be separated in a radial form.

In a display panel according to an another embodiment of the disclosure, the display panel includes a first substrate including a first region in which a main display area is disposed, and a second regions in which first auxiliary display areas are disposed and protruding respectively from sides of the first region, a second substrate disposed between second regions adjacent to each other and on which a second auxiliary display area is disposed, and an organic film connecting the first substrate and the second substrates. The second substrates may include a plurality of block substrates separated from each other. The plurality of block substrates may be connected through the organic film. Each of the plurality of block substrates may include pixels of the second auxiliary display area.

An edge sidewall of the first substrate may include wedge-shaped tapered surfaces, and becomes thinner as it goes toward an end of the sidewall.

The tapered surfaces may be symmetrical in an up-and-down direction.

A length of the tapered surfaces may be inversely proportional to a thickness of the first substrate.

The plurality of block substrates may be spaced apart in a shape of rings having a same center.

The plurality of block substrates may be separated in a radial form.

The display panel may further include a driving substrate, and a gate driving circuit disposed on the driving substrate. The driving substrate may include a first driving substrate disposed adjacent to the first auxiliary display area of the first substrate; and a second driving substrate disposed adjacent to the second auxiliary display area of the second substrates.

A pixels-per-inch (PPI) of the first substrate is higher than that of the second substrates.

An embodiment may provide a display panel with improved image quality and color sense in side and corner display areas, and a display device including the same.

An embodiment may provide a bezel-less display panel and a display device including the same.

Various and beneficial advantages and effects of the present disclosure are not limited to the above description, and will be more easily understood in the course of describing specific embodiments of the present disclosure.

BRIEF DESCRIPTION OF THE DRAWINGS

The above and other objects, features, and advantages of the present disclosure will become more apparent to those of ordinary skill in the art by describing exemplary embodiments thereof in detail with reference to the attached drawings.

FIG. 10 is a cross-sectional view of a display device according to another embodiment of the present disclosure.

FIG. 11 is a cross-sectional view of a display panel according to another embodiment of the disclosure.

FIG. 14 is a view showing various examples of a wedge-shaped sidewall of a glass substrate.

DETAILED DESCRIPTION OF EXEMPLARY EMBODIMENTS

Embodiments may be modified in other forms or various embodiments may be combined with each other, and the scope of the disclosure is not limited to each of the embodiments described below.

Although features described in a specific embodiment are not described in another embodiment, it may be understood as a description related to another embodiment unless they are contrary to or contradictory to the features in another embodiment.

For example, if the features of configuration A in a specific embodiment are described and features of configuration B in another embodiment are described, although the embodiment in which configuration A and configuration B are combined is not explicitly described, it should be understood as belonging to the scope of this disclosure unless there is a contradictory description.

In the description of embodiments, in the case where one element is described as being formed on "on or under" of another element, on or under includes both elements in which two elements are in direct contact with each other or one or more other elements are disposed between the two elements indirectly. In addition, when expressed as "on or under", it may include the meaning of not only an upward direction but also a downward direction based on one element.

Hereinafter, various embodiments will be described in detail with reference to the accompanying drawings.

Figure 1:
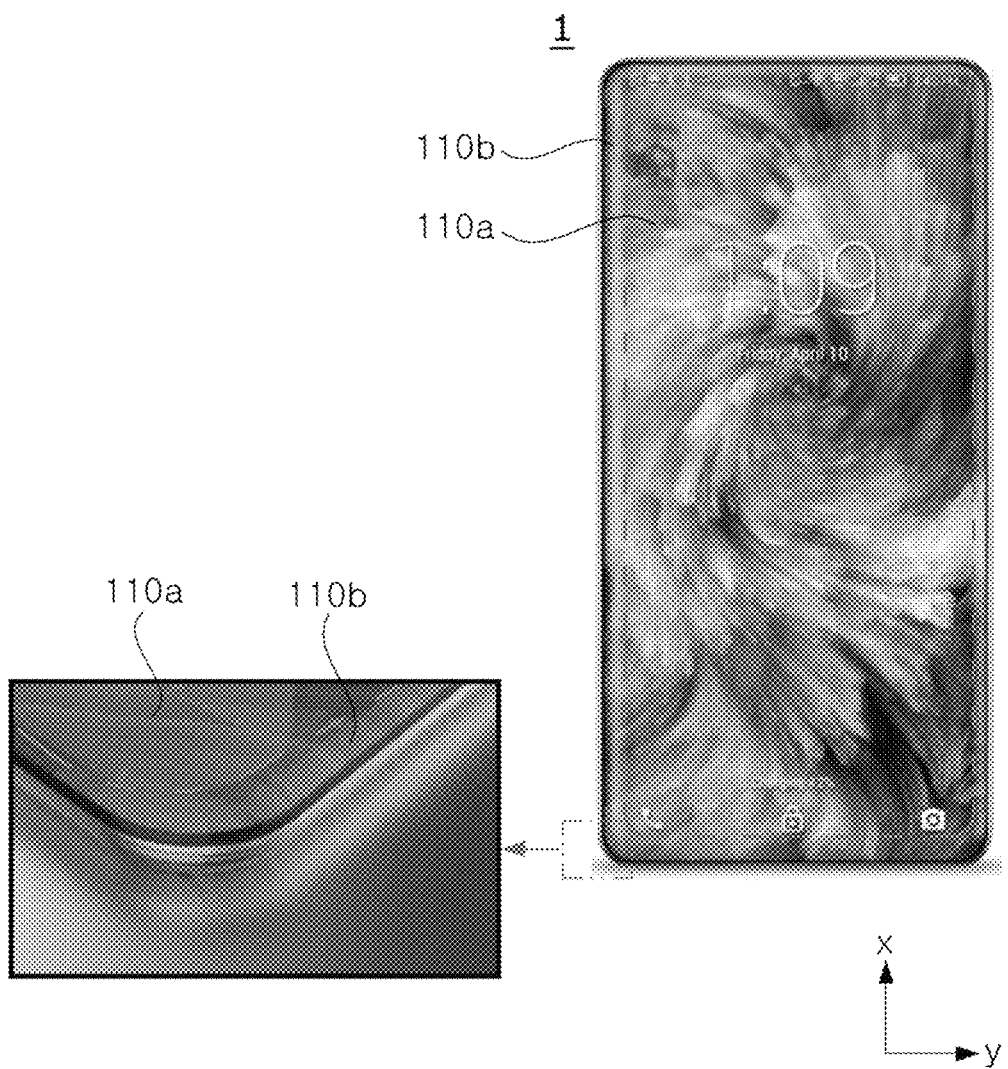
FIG. 1 is a diagram illustrating a display device according to an embodiment of the present disclosure.

FIG. 1 is a diagram illustrating a display device according to an embodiment of the present disclosure.

With reference to FIG. 1, the display device 1 according to an embodiment may include a main display area 110*a* and an auxiliary display area 110*b*. The main display area 110*a* is a region on which main information is displayed, and may be a main display on which the main screen to be viewed by the user is displayed. The main display area 110*a* may be located in the center of the display device 1. The main display area 110*a* may be larger than the auxiliary display area 110*b* and may include more pixels compared with the auxiliary display area 110*b*.

The auxiliary display area 110*b* is a region on which supplementary information is displayed and may be a sub-display. The auxiliary display area 110*b* may be disposed along the side and corner portions of the main display area 110a. The auxiliary display area 110b may be smaller than the main display area 110a, and may include fewer pixels compared with the main display area 110a.

The main display area 110a may be a flat display. The auxiliary display area 110b may be a curved display in which the whole or a part of the area is bent. That is, the whole of the auxiliary display area 110b may be a curved display, or one portion thereof may be a flat display and the remaining portion thereof may be a curved display.

Figure 2:
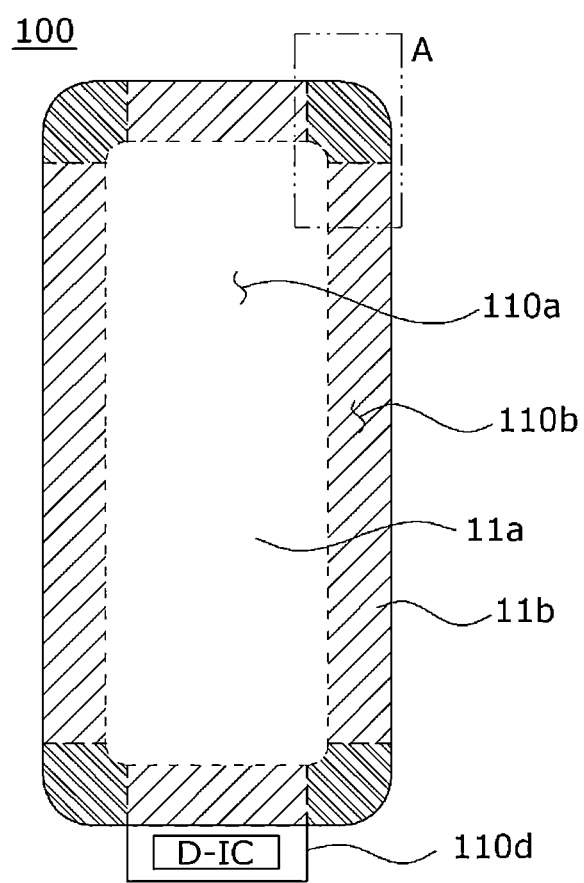
FIG. 2 is a diagram illustrating a display panel according to an embodiment of the present disclosure.

FIG. 2 is a diagram illustrating a display panel according to an embodiment of the present disclosure.

With reference to FIG. 2, the display panel 100 according to an embodiment of the present disclosure may include a glass substrate 10. The glass substrate 10 may be made of plate-shaped alkali-free or non-alkali glass. The glass substrate 10 may include a first substrate 11a and a second substrate 11b. The main display area 110a may be formed on the first substrate 11a, and the auxiliary display area 110b may be formed on the second substrate 11b. The first substrate 11a may be positioned at the center of the display panel 100, and the second substrate 11b may be disposed along the periphery of the first substrate 11a. That is, the second substrate 11b may be disposed at the side portions and corner portions of the first substrate 11a. The first substrate 11a and the second substrate 11b are spaced apart by a preset distance. As will be described later, the spaced-apart first substrate 11a and second substrate 11b may be connected by an organic film disposed on the first substrate 11a and the second substrate 11b.

A data driver 110d may be disposed at one side of the glass substrate 10. The data driver 110d may be implemented in the form of, but not limited to, a drive IC D-IC.

Figure 3:
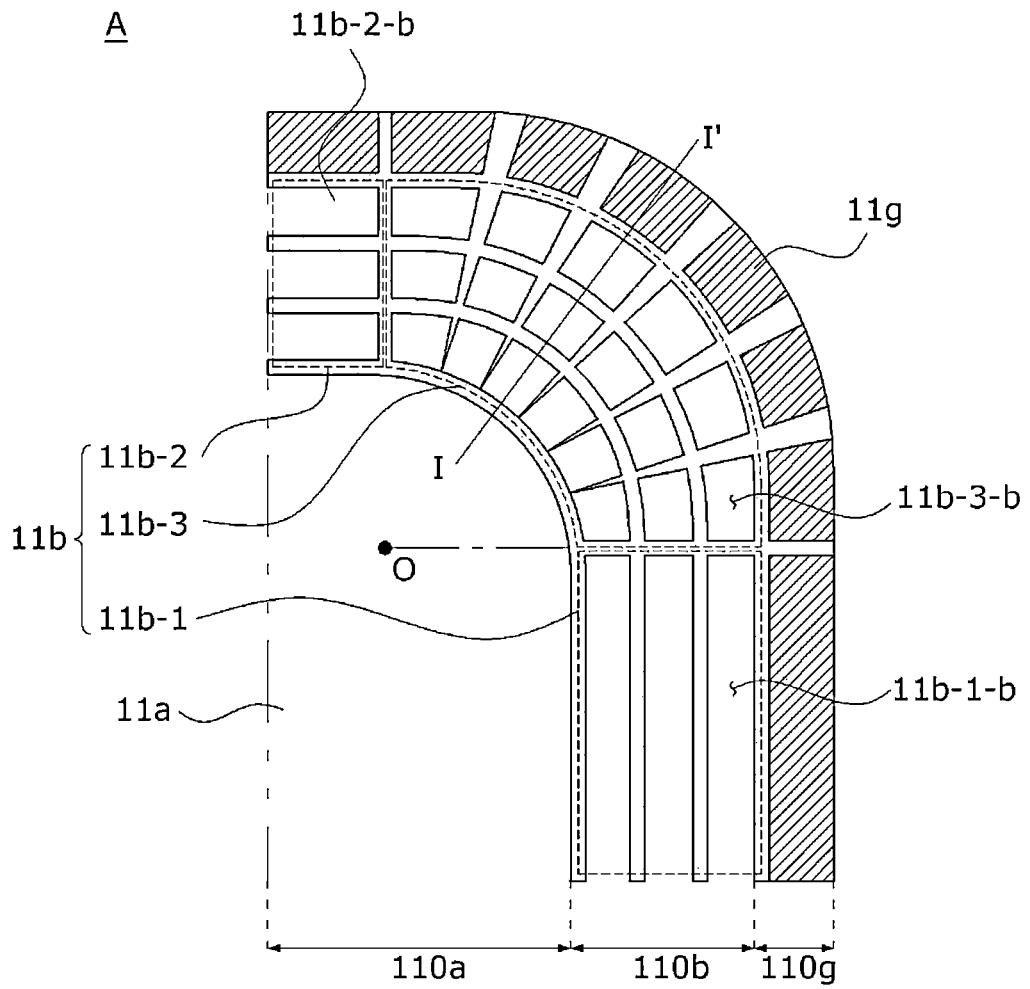
FIG. 3 is an enlarged view of region A in FIG. 2 according to an embodiment of the present disclosure.

FIG. 3 is an enlarged view of region A in FIG. 2 according to an embodiment of the present disclosure.

With reference to FIG. 3, the first substrate 11a may include a long side, a short side, and a corner portion where the long side and the short side meet. The second substrate 11b may include a second-first substrate 11b-1, a second-second substrate 11b-2, and a second-third substrate 11b-3. The second-first substrate 11b-1 may be disposed adjacent to the long side of the first substrate 11a. The second-second substrate 11b-2 may be disposed adjacent to the short side of the first substrate 11a. The second-third substrate 11b-3 may be disposed adjacent to the corner portion of the first substrate 11a.

The second-first substrate 11b-1 may include second-first block substrates 11b-1-b. The second-first block substrates 11b-1-b may be block substrates spaced apart from each other. More specifically, the second-first block substrates 11b-1-b may be block substrates spaced apart in a direction going away from the first substrate 11a. The second-first block substrates 11b-1-b spaced apart from each other may be connected by an organic film disposed on the second-first block substrates 11b-1-b as described later.

Pixels may be disposed on the second-first block substrates 11b-1-b. The density of pixels disposed on the second-first block substrates 11b-1-b may be lower than the density of pixels disposed on the first substrate 11a.

The second-second substrate 11b-2 may include the second-second block substrates 11b-2-b. The second-second block substrates 11b-2-b may be block substrates spaced apart from each other. More specifically, the second-second block substrates 11b-1-b may be block substrates spaced apart in a direction going away from the first substrate 11a. The second-second block substrates 11b-2-b spaced apart from each other may be connected by an organic film disposed on the second-second block substrates 11b-2-b as described later.

Pixels may be disposed on the second-second block substrates 11b-2-b. The density of pixels disposed on the second-second block substrates 11b-2-b may be lower than the density of pixels disposed on the first substrate 11a.

The second-third substrate 11b-3 may include second-third block substrates 11b-3-b. The second-third block substrates 11b-3-b may be block substrates spaced apart from each other. The second-third block substrates 11b-3-b may be block substrates spaced apart in a direction going away from the first substrate 11a. In more detail, the second-third block substrates 11b-3-b may be spaced apart from each other in a shape of rings having the same center O. In addition, the second-third block substrates 11b-3-b spaced apart in a shape of rings may be separated in a radial shape. The area of the second-third block substrates 11b-3-b may be in proportion to the distance to the first substrate 11a. More specifically, when the first substrate 11a and the second-third block substrates 11b-3-b are on the same plane, the size of the second-third block substrates 11b-3-b may increase as the distance from the first substrate 11a increases. The second-third block substrates 11b-3-b spaced apart from each other may be connected by an organic film disposed on the second-third block substrates 11b-3-b as described later.

Pixels may be disposed on the second-third block substrates 11b-3-b. The density of pixels disposed on the second-third block substrates 11b-3-b may be lower than the density of pixels disposed on the first substrate 11a.

The glass substrate 10 may further include a gate substrate 11g disposed in an outer edge region of the second substrate 11b. The gate substrate 11g may be spaced apart from the second substrate 11b, and may be connected to the second substrate 11b by an organic film to be described later. The gate substrate 11g may be radially spaced apart from the region adjacent to the second-third substrate 11b-3. A gate driver 110g including a gate driving circuit may be disposed on the gate substrate 11g.

Figure 4:
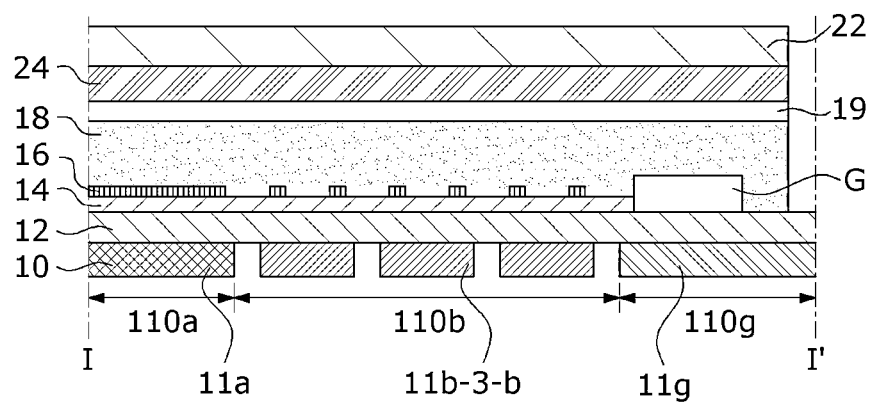
FIG. 4 is a cross-sectional view taken along the cut line I-I' in FIG. 3 according to an embodiment of the present disclosure.

FIG. 4 is a cross-sectional view taken along the cut line I-I' in FIG. 3 according to an embodiment of the present disclosure.

Next, for ease of description, the second-third substrate 11b-3 and the second-third block substrates 11b-3-b will be described for illustration, but this description may also be applied to the second-first substrate 11b-1 and the second-first block substrates 11b-1-b, and the second-second substrate 11b-2 and the second-second block substrates 11b-2-b.

With reference to FIG. 4, the organic film 12 may be disposed on the first substrate 11a, the second-third block substrates 11b-3-b, and the gate substrate 11g. The organic film 12 may connect substrates spaced apart from each other, for example, the first substrate 11a, the second-third block substrates 11b-3-b, and the gate substrate 11g. Although not shown in FIG. 4, the organic layer 12 may connect the second-first block substrates 11b-1-b, the second-second block substrates 11b-2-b, and the first substrate 11a. The organic film 12 may be a film including one selected from the group consisting of a polyimide polymer, a polyester polymer, a silicone polymer, an acrylic polymer, a polyolefin polymer, and a copolymer thereof. As polyimide has acid resistance and heat resistance, it can be applied to a high-temperature process of the circuit layer 14 and the light emitting element layer 16.

The circuit layer 14 and the gate driving circuit G may be disposed on the organic film 12. The circuit layer 14 may include a pixel circuit connected to data lines, gate lines, and power lines. The gate driving circuit G may be connected to the pixel circuit through gate lines. The pixel circuit and the gate driving circuit G may include circuit elements such as a thin film transistor (TFT) and a capacitor.

The light emitting element layer 16 may be formed on the circuit layer 14. The light emitting element layer 16 may include an OLED driven by a driving element of the pixel circuit. The OLED includes an organic compound layer formed between the anode and the cathode. The organic compound layer may include, but not limited to, a hole injection layer (HIL), a hole transport layer (HTL), an emission layer (EML), an electron transport layer (ETL), and an electron injection layer (EIL). When a voltage is applied to the anode and cathode of the OLED, holes passing through the hole transport layer (HTL) and electrons passing through the electron transport layer (ETL) move to the emission layer (EML) to form excitons, so that visible light is emitted from the emission layer (EML). The light emitting element layer 16 may further include a color filter array that selectively transmits red, green, and blue wavelengths.

As shown in FIG. 4, the density of the pixels disposed on the first substrate 11a may be higher than the density of the pixels disposed on the second substrate 11b, that is, the second-first to second-third substrates 11b-1, 11b-2 and 11b-3.

In addition, pixels may be not disposed in a region between the separated (or spaced apart) substrates. This is because that region is a region in which the organic layer 12 is contracted in the process of forming a curved display by bending the display panel 100. More specifically, when a pixel is disposed in the region of the organic layer 12 that contracts, the corresponding region may be visually recognized by the user. Hence, to prevent this, pixels are not formed in the contraction region, and pixels are formed only on the region in which the shrinkage does not occur, that is, the glass substrate 10 including the first substrate 11a and the second substrate 11b.

The light emitting element layer 16, the circuit layer 14, and the gate driving circuit G may be covered by a passivation layer omitted in the drawing and an encapsulation layer 18. The passivation layer and the encapsulation layer 18 may be composed of an inorganic film made of glass, metal, aluminum oxide ($AlO_x$) or silicon (Si)-based material, or may have a structure in which an organic film and an inorganic film are alternately stacked. The inorganic film blocks the penetration of moisture or oxygen. The organic film planarizes the surface of the inorganic film. When organic and inorganic films are stacked in multiple layers, the movement path of moisture or oxygen becomes longer compared with a single layer, so that the penetration of moisture/oxygen affecting the light emitting element layer 16 can be effectively blocked.

A polarizing plate 24 may be disposed on the encapsulation layer 18. The polarizing plate 24 may be adhered to the encapsulation layer 18 with an adhesive 19. The polarizing plate 24 improves outdoor visibility of the display device. The polarizing plate 24 reduces light reflected from the surface of the display panel 100 and blocks light reflected from the metal of the circuit layer to thereby improve the brightness of pixels. The polarizing plate 24 may be implemented as a polarizing plate or circular polarizing plate in which a linear polarizing plate and a phase retardation film are bonded.

A transparent cover window 22 may be disposed on the polarizing plate 24.

Although omitted in the drawing, wires of the touch sensors may be disposed between the encapsulation layer 18 and the polarizing plate 24.

Figure 5:
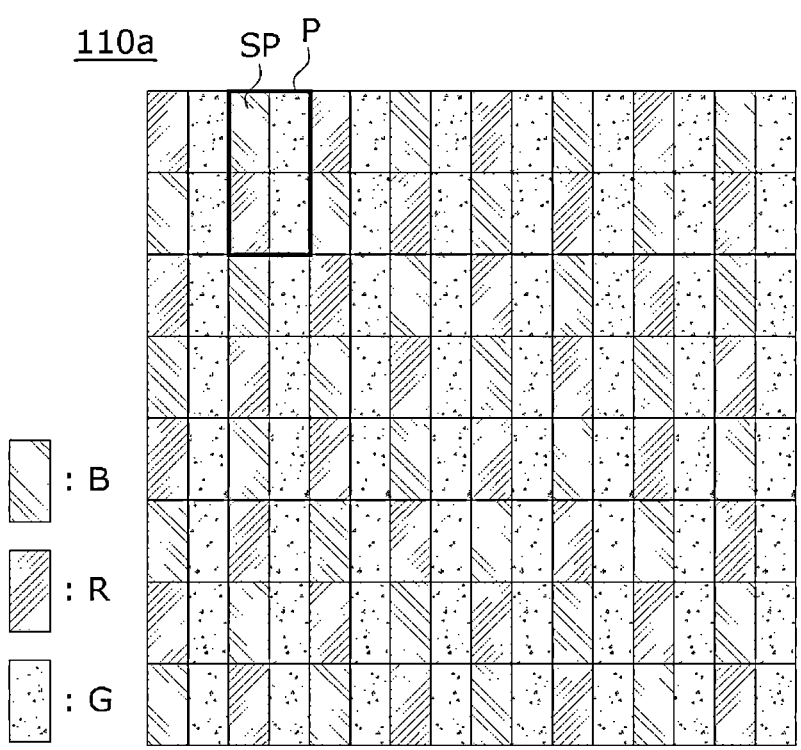
FIG. 5 is a diagram illustrating pixels in a main display area of a display panel according to an embodiment of the present disclosure.
Figure 6:
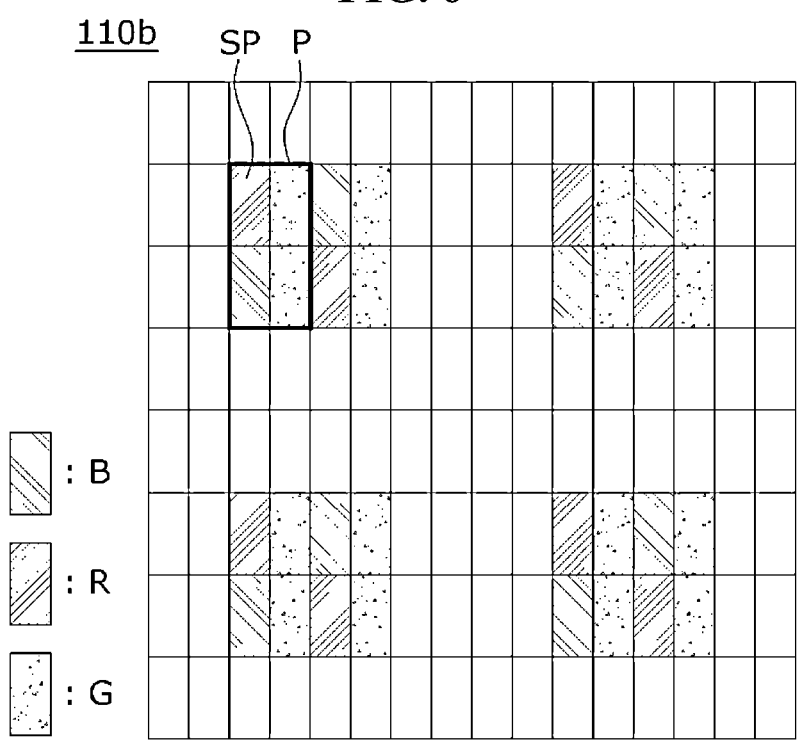
FIG. 6 is a diagram illustrating pixels in an auxiliary display area of a display panel according to an embodiment of the present disclosure.
Figure 7:
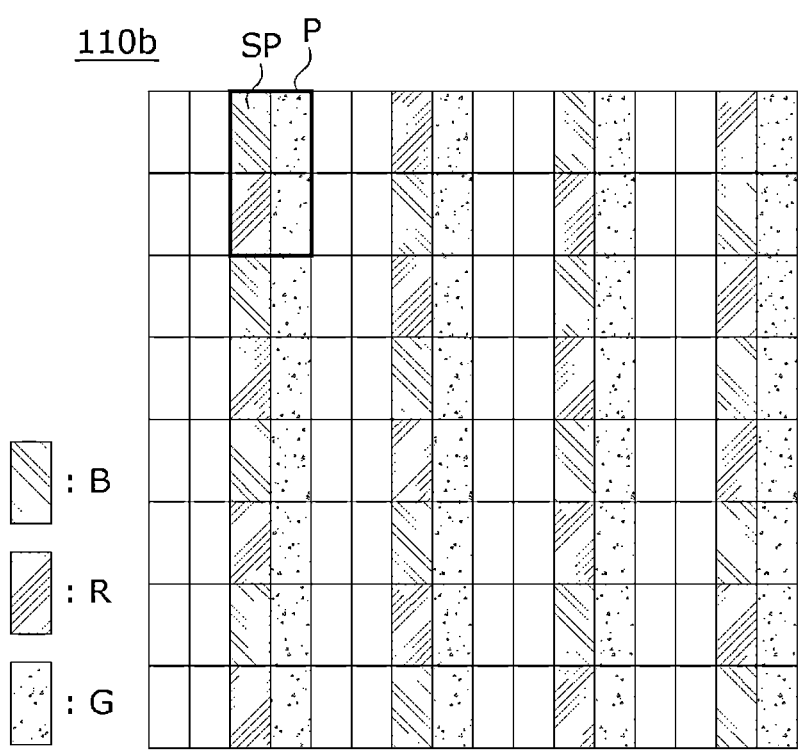
FIG. 7 is a diagram illustrating pixels in another auxiliary display area of a display panel according to an embodiment of the present disclosure.

Next, a description is given of the pixel density of the display panel 100 according to an embodiment of the present disclosure with reference to FIGS. 5 to 7.

FIG. 5 is a diagram illustrating some of pixels of the display panel, that is, pixels of the main display area 110a according to an embodiment of the present disclosure.

FIG. 6 is a diagram illustrating some of pixels of the display panel, that is, pixels of the auxiliary display area 110b according to an embodiment of the present disclosure.

With reference to FIGS. 5 and 6, the number of pixels P in the main display area 110a may be greater than the number of pixels P in the auxiliary display area 110b. That is, the pixels-per-inch (PPI) of the main display area 110a may be larger than the PPI of the auxiliary display area 110b. This is because the auxiliary display area 110b may be a curved display. In other words, assuming that the user looks at the display device from the front, the curved display, that is, the auxiliary display area 110b is viewed at an angle. In this case, the reason is that, if the same PPI value is assigned to the main display area 110a and the auxiliary display area 110b, the number of pixels P per unit area perceived by the user becomes larger in the auxiliary display area 110b.

FIG. 7 is another diagram illustrating pixels of the auxiliary display area 110b, as pixels of the display panel according to an embodiment of the present disclosure.

With reference to FIG. 7, unlike FIG. 6, the pixels P of the auxiliary display area 110b may be arranged in a manner that repeats a pattern in which pixels P are arranged in one column and are not arranged in the next column. This is an illustration for better understanding, and the arrangement of the pixels P in the auxiliary display area 110b is not limited to those shown in FIGS. 6 and 7.

Figure 8A:
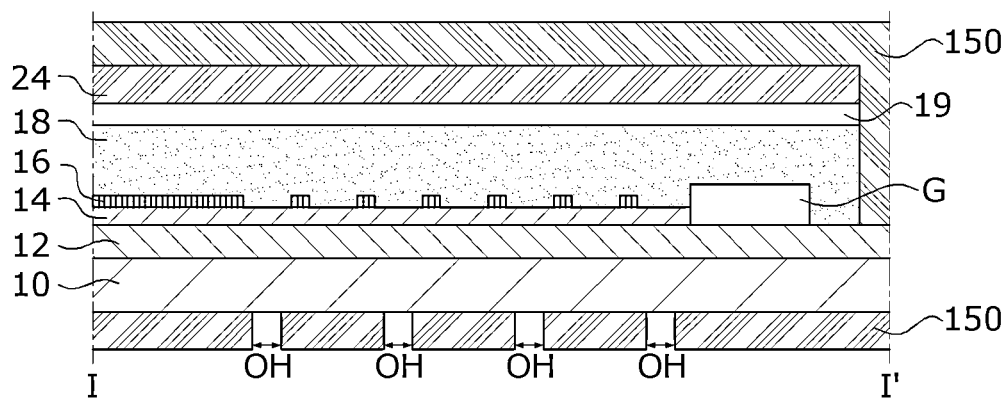
FIGS. 8A to 8C are views illustrating a part of a manufacturing process of the display device according to an embodiment of the present disclosure.
Figure 8B:
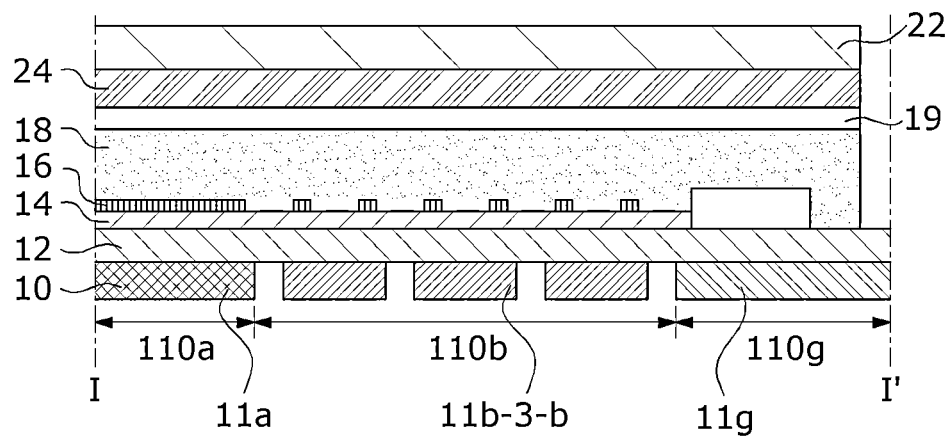
Figure 8C:
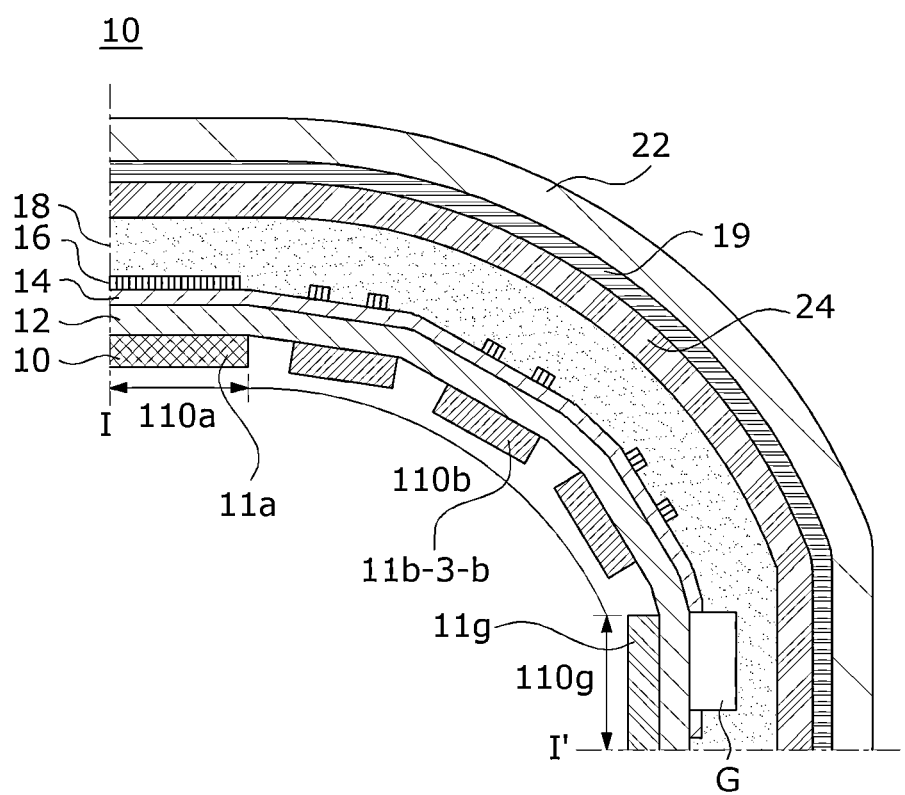

Next, a description is given of a manufacturing process of the display device according to an embodiment of the present disclosure with reference to FIGS. 8A to 8C.

FIG. 8A is a diagram illustrating an etching process of a glass substrate and is a cross-sectional view taken along line I-I' in FIG. 3 according to an embodiment of the present disclosure.

With reference to FIG. 8A, the organic layer 12 is formed on the glass substrate 10 that has not yet been separated into the first and second substrates 11a and 11b. As described above, the circuit layer 14 is formed on the organic layer 12, and the light emitting element layer 16 is formed on the circuit layer 14. As shown in the drawing, the density of light emitting elements disposed in the light emitting element layer 16 may be higher in the region to be the first substrate 11a than in the region to be the second substrate 11b. The encapsulation layer 18 is formed on the light emitting element layer, and the polarizing plate 24 is formed on the encapsulation layer 18. Here, the polarizing plate 24 may be, but not limited to, a coated polarizing plate formed by a coating method, and may also be a film-type polarizing plate. The adhesive 19 may be applied between the polarizing plate 24 and the encapsulation layer 18.

A mask 150 may be formed on the back surface of the glass substrate 10. The mask 150 may also be formed on the front surface of the display panel 100. This is to prevent damage to various layers that may occur during the etching process of the glass substrate 10. The mask 150 may expose a portion of the glass substrate 10. More specifically, the mask 150 may include opening holes OH exposing regions in which the glass substrate 10 is to be separated, that is, a region where the first substrate 11a and the second substrate 11*b* are spaced apart, a region where the second-first to second-third substrates 11*b*-1, 11*b*-2 and 11*b*-3 of the second substrate 11*b* are spaced apart, and a region where the second-first block substrates to second-third block substrates 11*b*-1-*b*, 11*b*-2-*b* and 11*b*-3-*b* are spaced apart.

The glass substrate 10 may be wet-etched by supplying an etchant to the opening holes OH formed in the mask 150 formed on the back surface of the glass substrate 10. The organic film 12 disposed on the glass substrate 10 prevents the etchant from penetrating into the circuit layer 14. That is, the organic film 12 may serve as an etch stopper. A hydrofluoric acid-based etchant may be used as the etchant, without being limited thereto.

FIG. 8B is a diagram showing a process of removing the mask.

With reference to FIG. 8B, after the glass substrate 10 is etched and separated into a plurality of sub-substrates, the mask 150 may be removed from the glass substrate 10. Then, when the cover window 22 is formed on the polarizing plate 24, the display panel 100 may be completed. That is, the display panel 100 can be completed that includes the first substrate 11*a* on which the main display area 110*a* is to be formed, the block substrates 11*b*-3-*b* on which the auxiliary display area 110*b* is to be formed, and the gate substrate 11*g* on which the gate driver 110*g* is to be formed.

FIG. 8C is a diagram illustrating a process of bending the display panel.

When the removal of the mask 150 is finished, the display panel 100 may be processed into a desired shape by bending it. The bent region of the display panel 100 may constitute the auxiliary display area 110*b*.

The reason why the glass substrate 10 of the display panel according to an embodiment of the present disclosure is divided or separated into a plurality of sub-substrates is to facilitate bending. Some of the substrate made of glass that is relatively unfavorable to bending is removed in the bending region and bending is performed by using the organic film 12 that is relatively favorable to bending. However, this structure is not essential for all bending regions. As in the embodiments to be described later, the glass substrate itself may be bent in the bending region at the side portion, and the above structure may be used in the bending region at the corner portion.

Next, a description is given of a display panel according to another embodiment of the present disclosure. Components that are substantially the same as those of the above-described embodiment are denoted by the same reference symbols, and the differences will be mainly described.

Figure 9:
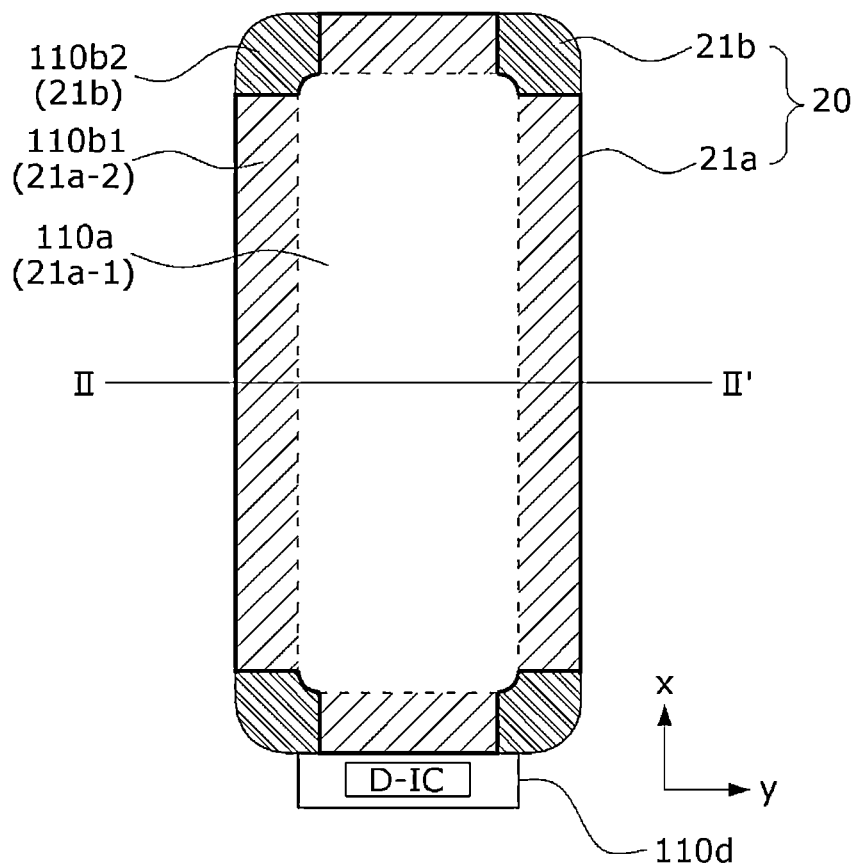
FIG. 9 is a diagram illustrating a display panel according to another embodiment of the present disclosure.

FIG. 9 is a diagram illustrating a display panel according to another embodiment of the present disclosure.

With reference to FIG. 9, the display panel 100 according to another embodiment of the present disclosure may include a glass substrate 20. The glass substrate 20 may be made of plate-shaped alkali-free or non-alkali glass. The glass substrate 20 may include a first substrate 21*a* and a second substrate 21*b*. The main display area 110*a* and some of the auxiliary display area 110*b* may be formed on the first substrate 21*a*, and the auxiliary display area 110*b* may be formed on the second substrate 21*b*.

The first substrate 21*a* may include a body part 21*a*-1 in which the main display area 110*a* is disposed, and a protrusion part 21*a*-2 in which the auxiliary display area 110*b* is disposed. The protrusion part 21*a*-2 is a region protruding from the side surface of the body part 21*a*-1. In other words, the first substrate 21*a* may have a configuration protruding from the center of the display panel 20 to the side, for example, a cross shape. The difference from the above-described embodiment is that the first substrate 21*a* may further include a protrusion part 21*a*-2, and the auxiliary display area 110*b* may be formed on the first substrate 21*a*, more specifically, the protrusion part 21*a*-2 of the first substrate 21*a*.

The second substrate 21*b* may be formed at a corner portion between the protrusion parts 21*a*-2 adjacent to each other of the first substrate 21*a*. The second substrate 21*b* may be a substrate spaced apart from the first substrate 21*a*. The spaced-apart first substrate 21*a* and second substrate 21*b* may be connected by an organic film disposed on the first substrate 21*a* and the second substrate 21*b*, as described later.

The structure of the second substrate 21*b* is substantially the same as that of the second-third substrate 11*b*-3 in the embodiment described with reference to FIG. 3. That is, the second substrate 21*b* may include a plurality of block substrates spaced apart from each other. More specifically, the block substrates may be spaced apart in a shape of rings having the same center. In addition, the block substrates spaced apart in a shape of rings can be separated in a radial shape. The block substrates spaced apart from each other may be connected by an organic film disposed on the second substrate 21*b* as described above.

Pixels may be disposed on the block substrates. The density of pixels disposed on the block substrates may be lower than the density of pixels disposed on the first substrate 21*a*. Also for pixels disposed on the first substrate 21*a*, the number of pixels in the main display area 110*a* may be larger than the number of pixels in the auxiliary display area 110*b*, but without being limited thereto.

The data driver 110*d* may be disposed on one side of the glass substrate 20. The data driver 110*d* may be implemented in the form of, but not limited to, a drive IC D-IC.

FIG. 10 is a cross-sectional view of a display device according to another embodiment of the present disclosure.

With reference to FIG. 10, unlike the display device according to the above-described embodiment, in the bending of the side portion of the display device 1, the glass substrate 20, that is, the first substrate 21*a* itself may be bent to form the auxiliary display area 110*b*. If the glass substrate 20 is made thin enough, the substrate made of glass can be bent. In addition, to reduce or minimize the stress applied to the glass substrate 20, the edge of the glass substrate 20 may be processed into a tapered surface. This will be described in detail with reference to FIGS. 11 to 14.

FIG. 11 is a cross-sectional view taken along line II-II' in FIG. 9 and is a cross-sectional view of the display panel according to another embodiment of the present disclosure.

Figure 12:
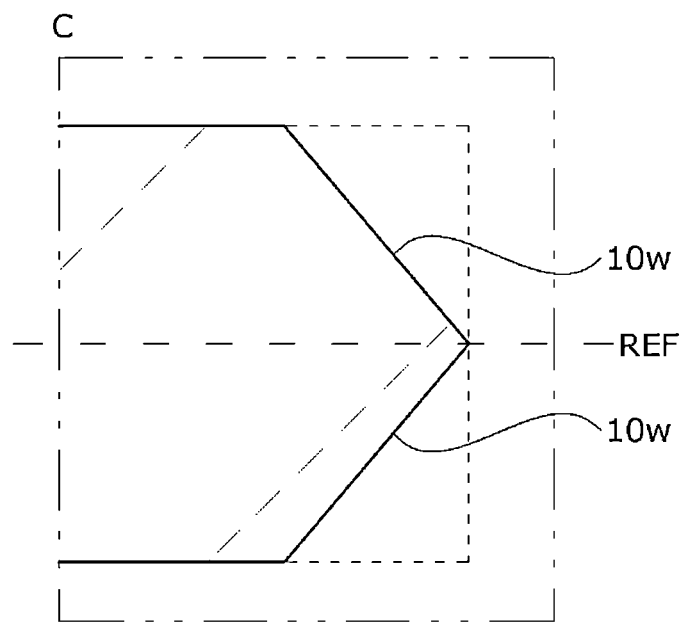
FIG. 12 is an enlarged view of substrate sidewall portion C in a wedge shape shown in FIG. 11 according to an embodiment of the present disclosure.

FIG. 12 is an enlarged view of substrate sidewall portion C in a wedge shape shown in FIG. 11.

With reference to FIGS. 11 and 12, the display panel 100 includes a glass substrate 20, an organic film 12 stacked on the glass substrate 20, and a circuit layer 14 and a light emitting element layer 16 disposed on the organic film 12. The glass substrate 20 may include a first substrate 21*a* and a second substrate 21*b*. The display panel 100 may further include an encapsulation layer 18 covering the circuit layer 14 and the light emitting element layer 16, a polarizing plate 24, and a cover window 22. The display panel 100 may further include a touch sensor layer 13 disposed between the encapsulation layer 18 and the polarizing plate 24. Touch sensors and touch sensor wires connecting the touch sensors to the touch sensor driver may be formed on the touch sensor layer 13.

It is preferable that the glass substrate 20 has a thin thickness, for example, 200 μm or less so that it can be flexibly bent.

Figure 13:
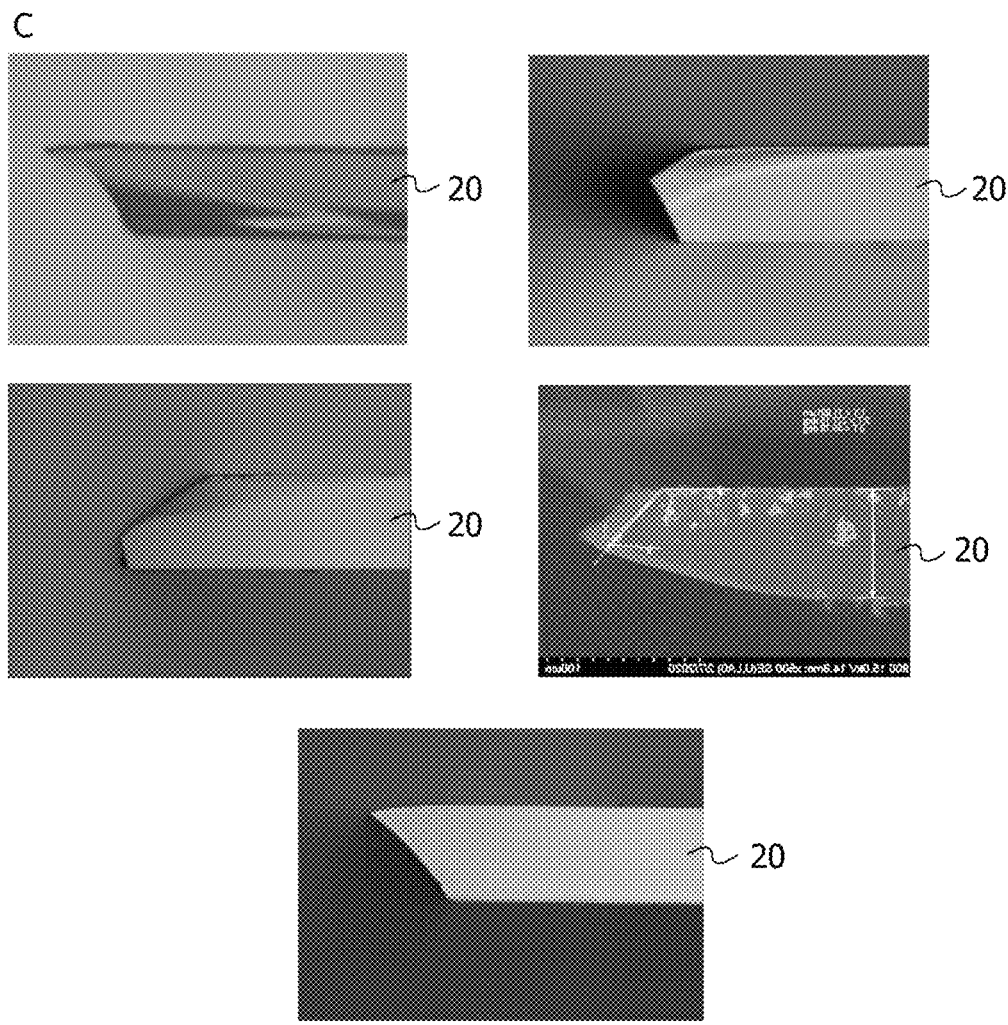
FIG. 13 is a diagram showing various examples of a wedge-shaped sidewall of a glass substrate.

The edge sidewall of the glass substrate 20 may be processed in a wedge shape. The sidewall of the corner portion in the glass substrate 20 where the two sides meet may also be processed in a wedge shape. When viewed from the edge cross section of the glass substrate 20, the wedge shape may mean that, as shown in FIG. 12, the tapered surfaces of the upper half and lower half thickness portions of the glass substrate 20 are symmetric with respect to the thickness center REF of the glass substrate 20, but, without being limited thereto, the tapered surfaces may have an asymmetric shape as shown in FIG. 13. Hence, the thickness of the glass substrate 20 may gradually decrease when going from the edge to the sidewall due to the upper/lower symmetric tapered surfaces 10w. The tapered portion of the glass substrate 20 protrudes out of the circuit layer 14, and the thickness thereof may decrease when going toward the end of the sidewall of the glass substrate 20.

Figure 15:
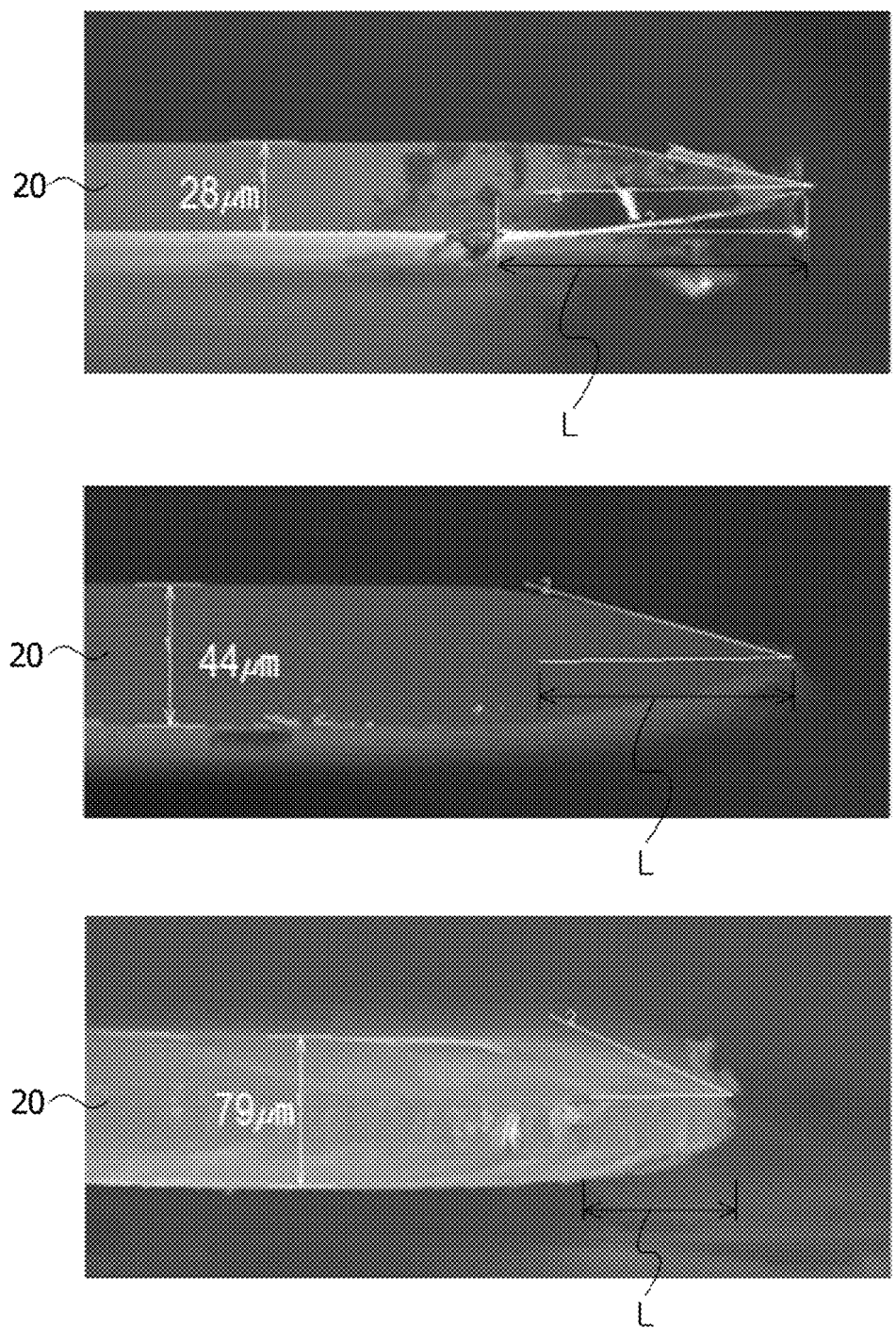
FIG. 15 is a diagram showing various examples of a wedge-shaped sidewall of a glass substrate.

FIGS. 13 to 15 are diagrams showing various examples of the wedge-shaped sidewall of a glass substrate.

With reference to FIG. 13, the sidewall of the glass substrate 20 may include a tapered surface. In other words, the thickness of the edge sidewall of the glass substrate 20 according to an embodiment may be smaller at the edge of the substrate than at the center of the substrate. That is, the thickness of the edge of the glass substrate 20 may be in inverse proportion to the distance from the center. The shape of the edge sidewall of the substrate may appear in various ways as in the embodiments shown in FIG. 13. The embodiments shown in FIG. 13 have upper and lower asymmetric tapered surfaces with respect to the thickness center of the glass substrate 20. Without being limited thereto, the shape of the tapered surfaces may be vertically symmetric with respect to the thickness center of the glass substrate 20 as shown in FIGS. 14 and 15.

With reference to FIGS. 14 and 15, the wedge-shaped sidewall of the glass substrate 20 is formed of vertically symmetric tapered surfaces 10w with respect to the thickness center REF of the glass substrate 20. As shown in the photographs of FIG. 15, as the thickness of the glass substrate 20 decreases, the length L of the tapered surfaces 10w may increase. In other words, the length L of the tapered surfaces 10w may be in inverse proportion to the thickness of the glass substrate 20.

Next, a detailed description is given of a process of forming a tapered surface on the glass substrate.

Figure 16:
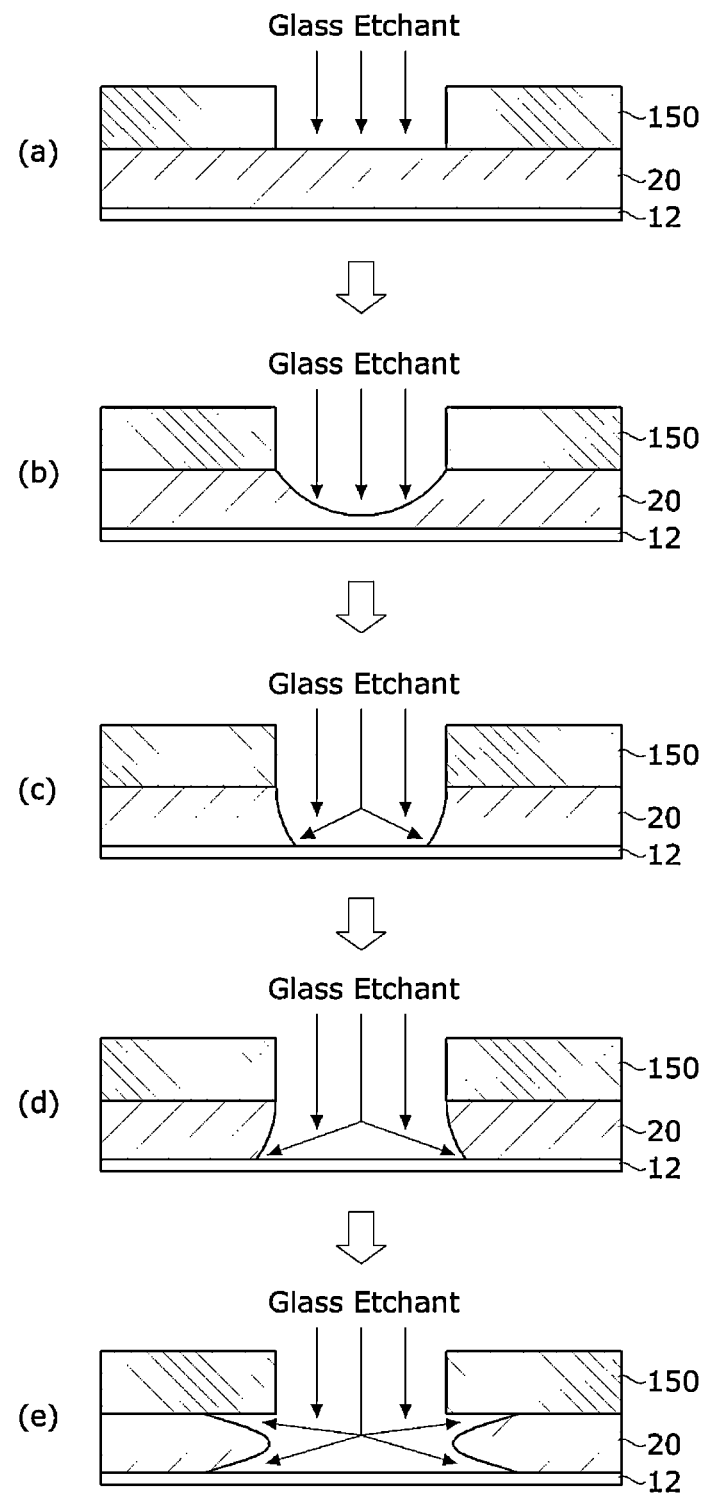
FIG. 16 is a diagram showing a process of manufacturing a wedge-shaped sidewall of a glass substrate according to an embodiment of the present disclosure.

FIG. 16 is a diagram illustrating an etching process of a glass substrate, and is a diagram viewed from the back surface of the glass substrate being turned over.

With reference to FIG. 16, a mask 150 may be disposed on one surface of the glass substrate 20, and an organic film 12 serving as an etch stopper may be disposed on the other surface of the glass substrate 20. A circuit layer, an organic light emitting layer, and the like are disposed on the organic film 12, but they are omitted for ease of description. The mask 150 may include an opening hole OH exposing the glass to the etchant. The shape, thickness, and spacing of the glass patterns may be determined according to the shape and spacing of the opening holes OH and the etching process time. The mask 150 may be removed after the etching process.

In an embodiment, the glass substrate 20 may be etched by spraying an etchant onto the glass substrate 20 to which the mask 150 is bonded, or by putting the glass substrate 20 into a water tank containing an etchant with a dipping method.

The glass etchant is supplied to the glass substrate 20 through the opening hole OH of the mask 150. The glass substrate 20 exposed to the opening hole OH of the mask 150 starts to be etched in response to the glass etchant as shown in part (a) of FIG. 16. The glass exposed to the etchant is etched and a groove begins to form in the glass substrate 20 as shown in part (b) of FIG. 16, and as the etching process time elapses, the depth of the groove increases as shown in part (c) of FIG. 16. When the etching process time further elapses in the etching process, as shown in parts (d) and (e) of FIG. 16, the etchant may penetrate between the glass substrate 20 and the organic film 12 and between the glass substrate 20 and the mask 150 to thereby form a tapered surface at the sidewall of the glass substrate 20.

As the etching process time increases, a tapered surface begins to form at the edge of the glass substrate 20 exposed to the etchant, and the tapered surface becomes longer as the process time further increases. In the etching process, when the lower surface of the glass substrate 20 is exposed to the etchant, the thickness of the glass substrate 10 decreases and the tapered surface becomes longer. The etching process is stopped when the glass substrate thickness and wedge shape of the cross section reach the design values.

Figure 17:
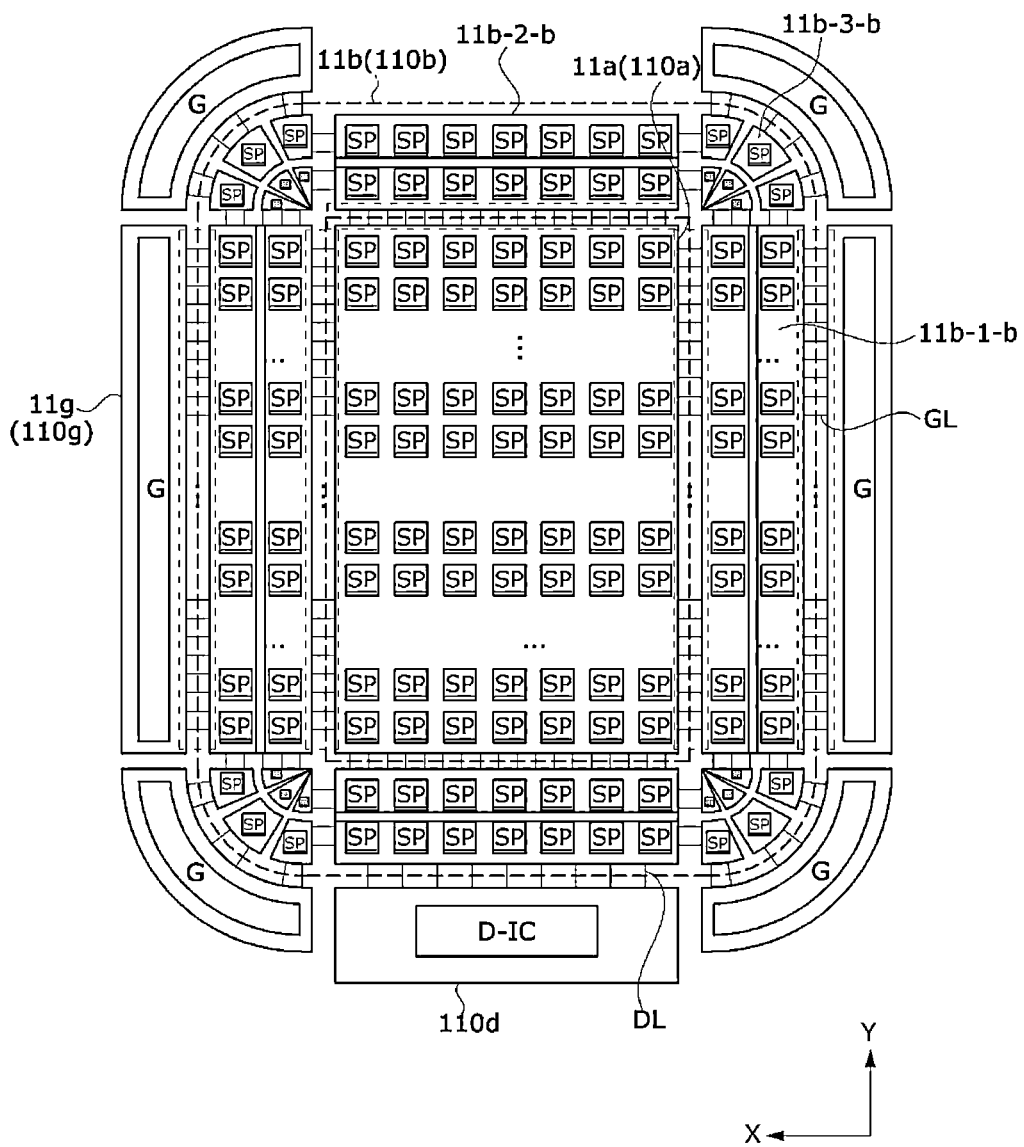
FIG. 17 is a block diagram illustrating an example of a display panel according to an embodiment of the present disclosure.

FIG. 17 is a block diagram illustrating an example of a display panel according to an embodiment of the present disclosure.

The embodiment may include a main display area 110a and an auxiliary display area 110b smaller than the main display area 110a. The main display area 110a and the auxiliary display area 110b include a pixel array of the screen on which an image is reproduced. The gate driver 110g includes a gate driving circuit G for supplying a gate pulse to the gate line. The data driver 110d includes a data driving circuit D for supplying a data pulse to the data line. The main display area 110a may be a main display on which main information is displayed, and the auxiliary display area 110b may be a sub-display on which supplementary information is displayed. The main display area 110a may be a display located at the front center, and the auxiliary display area 110b is a display located at the side surface and may be disposed on the side of the main display area 110a. The auxiliary display area 110b may include a curved display. In addition, the auxiliary display area 110b may be a sub-display positioned at an edge, that is, a corner of the main display area 110b. In this case, the auxiliary display area 110b may include a curved display, and may be a display area bent to fit the shape of the edge of the display device.

The main display area 110a may be formed on the first substrate 11a positioned at the center of the display panel 100. The auxiliary display area 110b may be formed on the second substrate 11b that is disposed on the periphery of the first substrate 11a and includes a plurality of sub-substrates. More specifically, the second substrate 11b may include the second-first to second-third substrates 11b-1, 11b-2 and 11b-3, which are sub-substrates spaced apart from each other, the second-first to second-third substrates 11b-1, 11b-2 and 11b-3 may each include the second-first to second-third block substrates 11b-1-b, 11b-2-b and 11b-3-b, and the auxiliary display area 110b may be formed on these sub-substrates.

A gate substrate 11g on which the gate driver 110g is to be formed may be disposed on one side surface of the second substrate 11b. A gate driving circuit G may be formed on the gate substrate 11g.

A data driver 110d may be formed on another side surface of the second substrate 11b. The data driver 110d may include a data driving circuit, and may be implemented in the form of, but not limited to, a drive IC D-IC.

The pixel array of the display panel 100 may include data lines DL, gate lines GL crossing the data lines DL, and subpixels SP arranged in a matrix form defined by the data lines DL and gate lines GL. The subpixels SP may be connected to the data driver 110d through the data lines DL, and may be connected to the gate driver 110g through the gate lines GL. This structure of the display panel 100 includes the above-described embodiments, a circuit layer and a light emitting element layer stacked on the glass substrate. The light-emitting element layer includes a light emitting element of a pixel circuit.

Figure 18:
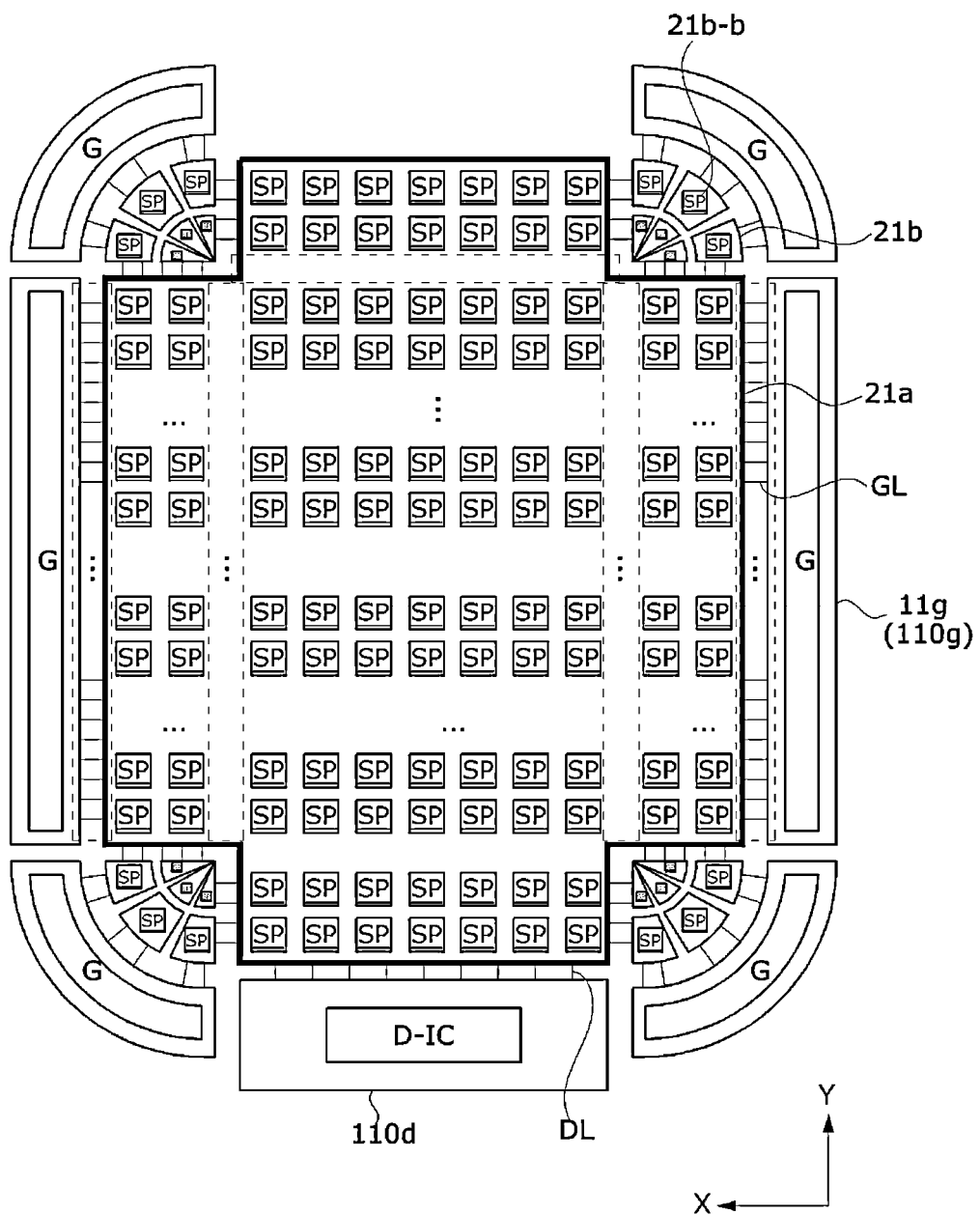
FIG. 18 is a block diagram illustrating an example of a display panel according to another embodiment of the disclosure.

FIG. 18 is a block diagram illustrating an example of a display panel according to another embodiment of the present disclosure. In this regard, differences are mainly described in comparison to the above-described embodiment.

As described above, the display panel 100 according to another embodiment of the present disclosure may include a first substrate 21a on which the main display area 110a and some of the auxiliary display area 110b are disposed, and a second substrate 21b on which the auxiliary display area 110b of the corner portion is disposed. Unlike the above-described embodiment, as the auxiliary display area 110b formed on the first substrate 21a is implemented by bending the glass substrate 20 itself, it is not required to have a structure in which the substrate on which the main display area 110a is formed and the substrate on which the auxiliary display area 110b is formed are spaced apart.

The auxiliary display area 110b formed on the second substrate 21b may include a plurality of separated block substrates 21b-b to be bent for implementing a curved display. The shape of the block substrates 21b-b and the pattern of pixels disposed on the block substrates 21b-b are substantially the same as those of the second-third block substrates 11b-3-b in FIG. 3.

A gate substrate 11g on which the gate driver 110g is to be formed may be disposed in the outer region on one side of the first substrate 21a and the second substrate 21b. A gate driving circuit G may be formed on the gate substrate 11g.

A data driver 110d may be formed in the outer region on another side of the first substrate 21a. The data driver 110d may include a data driving circuit, and may be implemented in the form of, but not limited to, a drive IC D-IC.

The pixel array of the display panel 100 may include data lines DL, gate lines GL crossing the data lines DL, and subpixels SP arranged in a matrix form defined by the data lines DL and gate lines GL. The subpixels SP may be connected to the data driver 110d through the data lines DL, and may be connected to the gate driver 110g through the gate lines GL.

Each of the pixels P includes subpixels having different colors to implement colors. The subpixels include a red subpixel (hereinafter referred to as "R subpixel"), a green subpixel (hereinafter referred to as "G subpixel"), and a blue subpixel (hereinafter referred to as "B subpixel"). Although not shown, each of the pixels P may further include a white subpixel. In the following description, the term "pixel" may be interpreted as "subpixel" unless otherwise defined. Each of the subpixels may include a pixel circuit.

The pixel circuit may include a light emitting element, a driving element that supplies current to the light emitting element, a plurality of switch elements for programming a conduction condition of the driving element and switching the current path between the driving element and the light emitting element, and a capacitor maintaining the gate voltage of the driving element.

The display panel driver writes pixel data of an input image to the pixels P. The display panel driver includes a data driver 110d that supplies a data voltage of pixel data to the data lines DL, and a gate driver 110g that sequentially supplies a gate pulse to the gate lines GL. The data driver 110d may be integrated in a drive IC D-IC.

Figure 19:
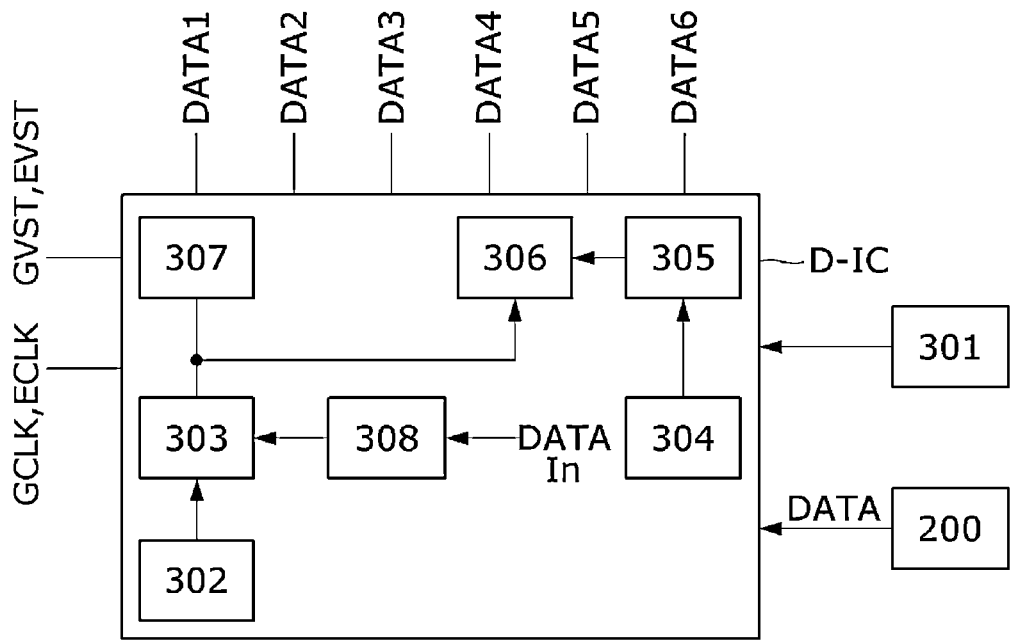
FIG. 19 is a schematic block diagram showing the configuration of a drive IC according to an embodiment of the present disclosure.

FIG. 19 is a schematic block diagram showing the configuration of a drive IC.

The drive IC D-IC may be adhered to the display panel 100. The drive IC D-IC receives pixel data of an input image and a timing signal from the host system 200, supplies a data voltage of the pixel data to the pixels, and synchronizes the data driver 110d and the gate driver 110g.

The drive IC D-IC is connected to the data lines DL1 to DL6 through data output channels, and supplies a voltage of a data signal to the data lines. The drive IC D-IC may output a gate timing signal for controlling the gate driver 110g through gate timing signal output channels. The gate timing signal generated from the timing controller 303 may include a start pulse (gate start pulse, VST), a shift clock (gate shift clock, CLK), and the like. The start pulse VST and the shift clock CLK swing between the gate-on voltage VGL and the gate-off voltage VGH. The gate timing signal (VST, CLK) output from the level shifter 307 is applied to the gate driver 110g and controls the shift operation of the gate driver 110g.

The gate driver 110g may include a shift register formed on the circuit layer of the display panel 100 together with the pixel array. The shift register of the gate driver 110g supplies a gate signal to the gate lines GL in sequence under the control of the timing controller 30. The gate signal may include a scan pulse and an EM pulse of an emission signal. The shift register may include a scan driver that outputs a scan pulse and an EM driver that outputs an EM pulse. In FIG. 19, GVST and GCLK are a gate timing signal input to the scan driver. EVST and ECLK are a gate timing signal input to the EM driver.

The drive IC D-IC may be connected to the host system 200, the first memory 301, and the display panel 100. The drive IC D-IC may include a data receiving and calculating unit 308, a timing controller 303, a data driver 306, a gamma compensation voltage generator 305, a power supply 304, a second memory 302, and the like.

The data receiving and calculating unit 308 includes a receiving unit for receiving pixel data input as a digital signal from the host system 200, and a data operation unit that processes pixel data input through the receiving unit to improve image quality. The data operation unit may include a data restoration unit that decodes and restores compressed pixel data, and an optical compensation unit that adds a preset optical compensation value to the pixel data. The optical compensation value may be set to a value for correcting the luminance of each pixel data based on the measured luminance of the screen with respect to a camera image captured in the manufacturing process.

The timing controller 303 provides pixel data of an input image received from the host system 200 to the data driver 306. The timing controller 303 generates a gate timing signal for controlling the gate driver 110g and a source timing signal for controlling the data driver 306 to thereby control operation timings of the gate driver 110g and the data driver 306.

The data driver 306 converts pixel data (digital signal) received from the timing controller 303 into a gamma compensation voltage through a digital to analog converter (hereinafter referred to as "DAC") to output a voltage of data signals DATA1 to DATA6 (hereinafter referred to as "data voltage"). The data voltage output from the data driver 306 is supplied to the data lines DL1 to DL6 of the pixel array through an output buffer (source AMP) connected to the data channel of the drive IC D-IC.

The gamma compensation voltage generator 305 divides the gamma reference voltage from the power supply 304 through a divider circuit to generate a gamma compensation voltage for each gray level. The gamma compensation voltage is an analog voltage in which a voltage is set for each gray level of pixel data. The gamma compensation voltage output from the gamma compensation voltage generator 305 is provided to the data driver 306.

The power supply 304 generates power required for driving the pixel array of the display panel 100, the gate driver 110g, and the drive IC D-IC by using a DC-DC converter. The DC-DC converter may include a charge pump, a regulator, a buck converter, a boost converter, and the like. The power supply 304 may adjust the DC input voltage from the host system 200 to generate DC power, such as gamma reference voltage, gate-on voltage VGL, gate-off voltage VGH, pixel driving voltage ELVDD, low-potential power voltage ELVSS, or initialization voltage Vini. The gamma reference voltage is supplied to the gamma compensation voltage generator 305. The gate-on voltage VGL and the gate-off voltage VGH are supplied to the level shifter 307 and the gate driver 110g. Pixel power such as pixel driving voltage ELVDD, low-potential power voltage ELVSS, or initialization voltage Vini is supplied commonly to the pixels P. The initialization voltage Vini is set to a DC voltage that is lower than the pixel driving voltage ELVDD and is lower than the threshold voltage of the light emitting element OLED, suppressing light emission of the light emitting element OLED.

The second memory 302 stores compensation values, register setting data, and the like received from the first memory 301 when power is supplied to the drive IC D-IC. The compensation values can be applied to various algorithms for improving image quality. The compensation values may include an optical compensation value. The register setting data defines the operations of the data driver 306, the timing controller 303, the gamma compensation voltage generator 305, and the like. The first memory 301 may include a flash memory. The second memory 302 may include a static RAM (SRAM).

The host system 200 may be implemented with an application processor (AP). The host system 200 may transmit pixel data of an input image to the drive IC D-IC through a mobile industry processor interface (MIPI). The host system 200 may be connected to the drive IC D-IC through, for example, a flexible printed circuit (FPC).

In the display device according to the present disclosure, the pixel circuit and the gate driver may include a plurality of transistors. The transistors may be implemented with an oxide thin film transistor (oxide TFT) including an oxide semiconductor, and a low temperature polysilicon (LTPS) TFT including LTPS. Each of the transistors can be implemented with a p-channel TFT or an n-channel TFT. In the embodiment, the transistors of the pixel circuit are mainly described as being implemented with p-channel TFTs, but the present disclosure is not limited thereto.

The transistor is a three-electrode element including a gate, a source, and a drain. The source is an electrode that supplies carriers to the transistor. Within the transistor, carriers start to flow from the source. The drain is an electrode through which carriers exit from the transistor. In the transistor, carriers flow from the source to the drain. In the case of an n-channel transistor, as carriers are electrons, the source voltage has a voltage lower than the drain voltage so that electrons can flow from the source to the drain. In the n-channel transistor, a current flows in a direction from the drain to the source. In the case of a p-channel transistor (PMOS), as carriers are holes, the source voltage is higher than the drain voltage so that holes can flow from the source to the drain. In the p-channel transistor, as holes flow from the source to the drain, a current flows from the source to the drain. It should be noted that the source and the drain of the transistor are not fixed. For example, the source and the drain may be changed according to an applied voltage. Therefore, the present disclosure is not limited due to the source and drain of the transistor. In the following description, the source and drain of the transistor will be referred to as first and second electrodes.

The gate pulse swings between a gate-on voltage and a gate-off voltage. The gate-on voltage is set to a voltage higher than the threshold voltage of the transistor, and the gate-off voltage is set to a voltage lower than the threshold voltage of the transistor. The transistor is turned on in response to the gate-on voltage, but it is turned off in response to the gate-off voltage. In the case of an n-channel transistor, the gate-on voltage may be a gate high voltage VGH, and the gate-off voltage may be a gate low voltage VGL. In the case of a p-channel transistor, the gate-on voltage may be a gate low voltage VGL, and the gate-off voltage may be a gate high voltage VGH.

The driving element in each pixel may be implemented with a transistor. The driving element should have uniform electrical characteristics among all pixels, but there may be differences between pixels due to process variations and variations in element characteristics, and it may change according to the lapse of display driving time. To compensate for variations in electrical characteristics of the driving element, the display device may include an internal compensation circuit and an external compensation circuit. The internal compensation circuit is added to the pixel circuit at each of the subpixels, and samples the threshold voltage Vth and/or the mobility p of the driving element, which vary according to the electrical characteristics of the driving element, and compensates for the change in real time. The external compensation circuit transmits a threshold voltage and/or mobility of the driving element sensed through a sensing line connected to each of the subpixels to an external compensation unit. The compensation unit of the external compensation circuit compensates for changes in electrical characteristics of the driving element by modulating the pixel data of the input image in consideration of the sensing result. The external compensation circuit senses a voltage of the pixel that changes according to electrical characteristics of the driving element, and modulates the data of an input image in an external circuit based on the sensed voltage, thereby compensating for variations in electrical characteristics of the driving element between pixels.

Figure 20:
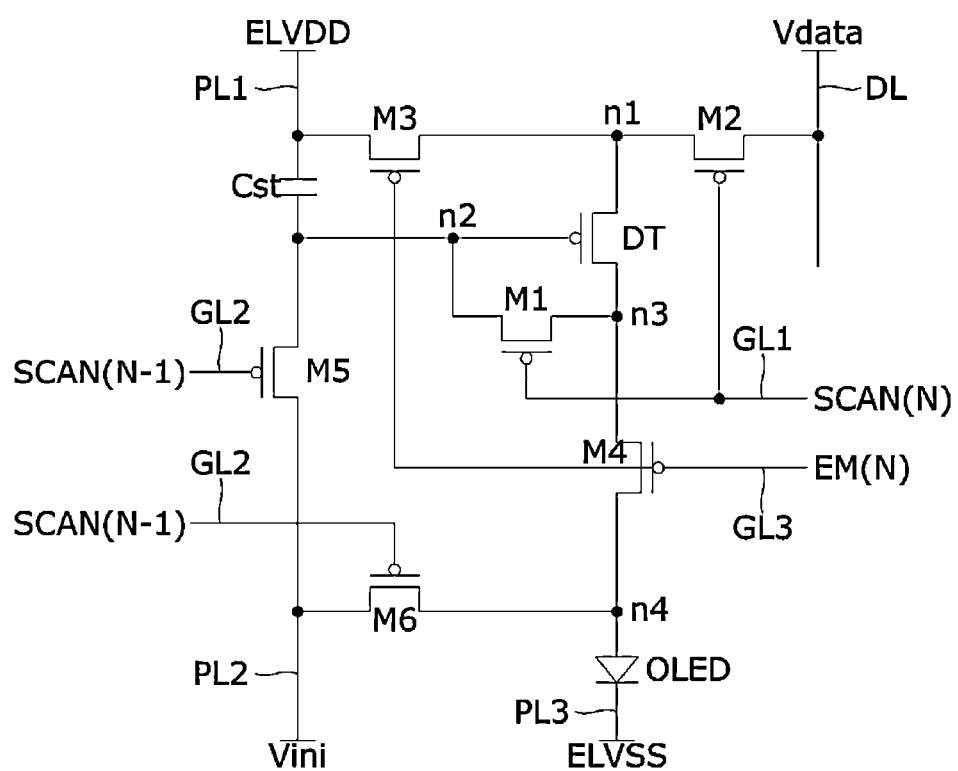
FIG. 20 is a circuit diagram showing an example of a pixel circuit.
Figure 21:
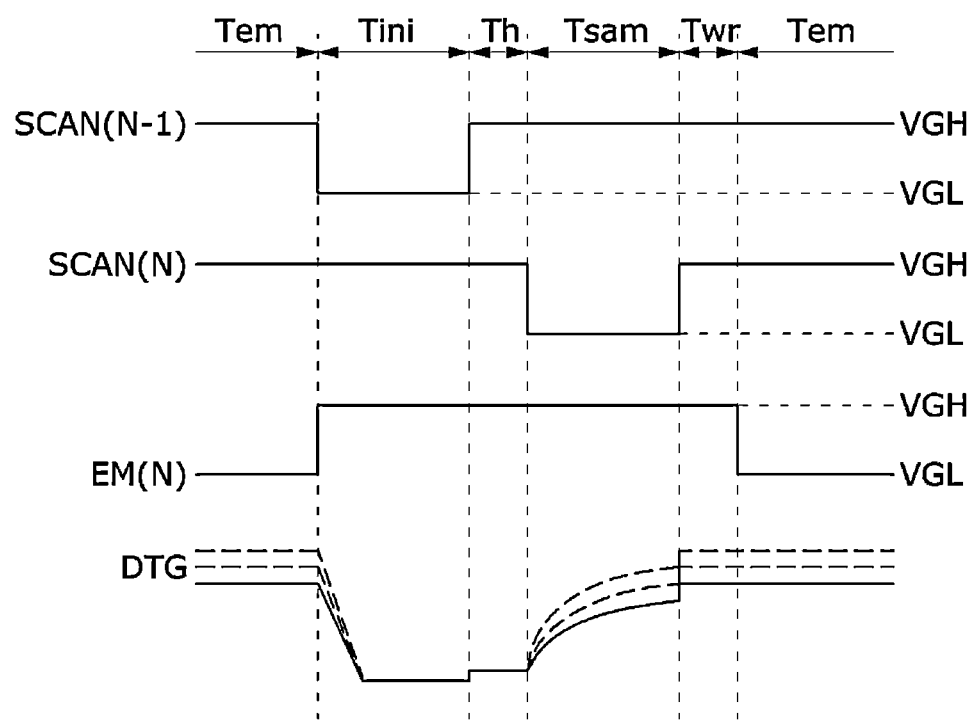
FIG. 21 is a diagram illustrating timing of driving the pixel circuit shown in FIG. 20.

FIG. 20 is a circuit diagram showing an example of a pixel circuit. FIG. 21 is a diagram illustrating timing of driving the pixel circuit shown in FIG. 20. The pixel circuit applicable to the present disclosure is not limited to FIGS. 20 and 21.

With reference to FIGS. 20 and 21, the pixel circuit includes a light emitting element OLED, a driving element DT for supplying a current to the light emitting element OLED, and an internal compensation circuit that samples the threshold voltage Vth of the driving element DT by using a plurality of switch elements M1 to M6 and compensates for the gate voltage of the driving element DT as much as the threshold voltage Vth of the driving element DT. Each of the driving element DT and the switch elements M1 to M6 may be implemented with a p-channel TFT.

The driving period of the pixel circuit using an internal compensation circuit may be divided into an initialization period Tini, a sampling period Tsam, a data writing period (Twr), and an emission period Tem.

During the initialization period Tini, the N−1$^{th}$ scan signal SCAN(N−1) is generated as a pulse of the gate-on voltage VGL, and the voltage of each of the N$^{th}$ scan signal SCAN(N) and the emission signal EM(N) is the gate-off voltage VGH. During the sampling period Tsam, the N$^{th}$ scan signal SCAN(N) is generated as a pulse of the gate-on voltage VGL, and the voltage of the N−1$^{th}$ scan signal SCAN(N−1) and the emission signal EM(N) is the gate-off voltage VGH. During the data writing period Twr, the voltage of each of the N−1$^{th}$ scan signal SCAN(N−1), the N$^{th}$ scan signal SCAN(N), and the emission signal EM(N) is the gate-off voltage VGH. During at least some of the emission period Tem, the emission signal EM(N) is generated as the gate-on voltage VGL, and the voltage of each of the N−1$^{th}$ scan signal SCAN(N−1) and the N$^{th}$ scan signal SCAN(N) is generated as the gate-off voltage VGH.

During the initialization period Tini, the fifth and sixth switch elements M5 and M6 are turned on according to the gate-on voltage VGL of the N−1$^{th}$ scan signal SCAN(N−1), initializing the pixel circuit. During the sampling period Tsam, the first and second switch elements M1 and M2 are turned on according to the gate-on voltage VGL of the N$^{th}$ scan signal SCAN(N), and the threshold voltage of the driving element DT is sampled and stored in the capacitor Cst. During the data writing period Twr, the first to sixth switch elements M1 to M6 remain in the off state. During the emission period Tem, the third and fourth switch elements M1 and M2 are turned on and the light emitting element OLED emits light. During the emission period Tem, to precisely express the luminance of the low gradation with the duty ratio of the emission signal EM(N), the emission signal EM(N) swings at a preset duty ratio between the gate-on low voltage VGL and the gate-off voltage VGH, so that the third and fourth switch elements M1 and M2 may be repeatedly turned on and off.

The light emitting element OLED may be implemented with an organic light emitting diode or an inorganic light emitting diode. Hereinafter, a description is given of an example in which the light emitting element OLED is implemented with an organic light emitting diode.

The light emitting element OLED may include an organic compound layer formed between the anode and the cathode. The organic compound layer may include, but not limited to, a hole injection layer (HIL), a hole transport layer (HTL), an emission layer (EML), an electron transport layer (ETL), and an electron injection layer (EIL). When a voltage is applied to the anode and cathode of the OLED, holes passing through the hole transport layer (HTL) and electrons passing through the electron transport layer (ETL) move to the emission layer (EML) to form excitons, so that visible light is emitted from the emission layer (EML).

The anode of the light emitting element OLED is connected to the fourth node n4 between the fourth and sixth switch elements M4 and M6. The fourth node n4 is connected to the anode of the light emitting element OLED, the second electrode of the fourth switch element M4, and the second electrode of the sixth switch element M6. The cathode of the light emitting element OLED is connected to the VSS electrode PL3 to which the low-potential power voltage VSS is applied. The light emitting element OLED emits light with a current Ids flowing according to the gate-source voltage Vgs of the driving element DT. The current path of the light emitting element OLED is switched by the third and fourth switch elements M3 and M4.

The storage capacitor Cst is connected between the VDD line PL1 and the first node n1. The data voltage Vdata compensated as much as the threshold voltage Vth of the driving element DT is charged in the storage capacitor Cst. As the data voltage Vdata is compensated for as much as the threshold voltage Vth of the driving element DT at each of the subpixels, characteristic variations of the driving element DT are compensated for at the subpixels.

The first switch element M1 is turned on in response to the gate-on voltage VGL of the N$^{th}$ scan pulse SCAN(N) to thereby connect the second node n2 and the third node n3. The second node n2 is connected to the gate of the driving element DT, the first electrode of the storage capacitor Cst, and the first electrode of the first switch element M1. The third node n3 is connected to the second electrode of the driving element DT, the second electrode of the first switch element M1, and the first electrode of the fourth switch element M4. The gate of the first switch element M1 is connected to the first gate line GL1 to receive the N$^{th}$ scan pulse SCAN(N). The first electrode of the first switch element M1 is connected to the second node n2, and the second electrode of the first switch element M1 is connected to the third node n3.

The second switch element M2 is turned on in response to the gate-on voltage VGL of the N$^{th}$ scan pulse SCAN(N) to thereby supply the data voltage Vdata to the first node n1. The gate of the second switch element M2 is connected to the first gate line GL1 to receive the N$^{th}$ scan pulse SCAN(N). The first electrode of the second switch element M2 is connected to the first node n1. The second electrode of the second switch element M2 is connected to the data line DL to which the data voltage Vdata is applied. The first node n1 is connected to the first electrode of the second switch element M2, the second electrode of the third switch element M3, and the first electrode of the driving element DT.

The third switch element M3 is turned on in response to the gate-on voltage VGL of the emission signal EM(N) to thereby connect the VDD line PL1 to the first node n1. The gate of the third switch element M3 is connected to the third gate line GL3 to receive the emission signal EM(N). The first electrode of the third switch element M3 is connected to the VDD line PL1. The second electrode of the third switch element M3 is connected to the first node n1.

The fourth switch element M4 is turned on in response to the gate-on voltage VGL of the emission signal EM(N) to thereby connect the third node n3 to the anode of the light emitting element OLED. The gate electrode of the fourth switch element M4 is connected to the third gate line GL3 to receive the emission signal EM(N). The first electrode of the fourth switch element M4 is connected to the third node n3, and the second electrode is connected to the fourth node n4.

The fifth switch element M5 is turned on in response to the gate-on voltage VGL of the N−1$^{th}$ scan pulse SCAN(N−1) to thereby connect the second node n2 to the Vini line PL2. The gate of the fifth switch element M5 is connected to the second gate line GL2 to receive the N-1$^{th}$ scan pulse SCAN(N-1). The first electrode of the fifth switch element M5 is connected to the second node n2, and the second electrode is connected to the Vini line PL2.

The sixth switch element M6 is turned on in response to the gate-on voltage VGL of the N-1$^{th}$ scan pulse SCAN(N-1) to thereby connect the Vini line PL2 to the fourth node n4. The gate of the sixth switch element M6 is connected to the second gate line GL2 to receive the N-1$^{th}$ scan pulse SCAN(N-1). The first electrode of the sixth switch element M6 is connected to the Vini line PL2, and the second electrode is connected to the fourth node n4.

The driving element DT drives the light emitting element OLED by adjusting the current flowing through the light emitting element OLED according to the gate-source voltage Vgs. The driving element DT includes a gate connected to the second node n2, a first electrode connected to the first node n1, and a second electrode connected to the third node n3.

During the initialization period Tini, the N-1$^{th}$ scan pulse SCAN(N-1) is generated as the gate-on voltage VGL. The N$^{th}$ scan pulse SCAN(N) and the emission signal EM(N) maintain the gate-off voltage VGH during the initialization period Tini. Hence, the fifth and sixth switch elements M5 and M6 are turned on during the initialization period Tini, so that the second and fourth nodes n2 and n4 are initialized to Vini. A hold period Th may be configured between the initialization period Tini and the sampling period Tsam. In the hold period Th, the gate pulses SCAN(N-1), SCAN(N) and EM(N) keep the previous state.

During the sampling period Tsam, the N$^{th}$ scan pulse SCAN(N) is generated as the gate-on voltage VGL. The pulse of the N$^{th}$ scan pulse SCAN(N) is synchronized with the data voltage Vdata of the N$^{th}$ pixel line. The N-1$^{th}$ scan pulse SCAN(N-1) and the emission signal EM(N) maintain the gate-off voltage VGH during the sampling period Tsam. Hence, the first and second switch elements M1 and M2 are turned on during the sampling period Tsam.

During the sampling period Tsam, the gate voltage DTG of the driving element DT is increased by the current flowing through the first and second switch elements M1 and M2. Since the driving element DT is turned off when the first switch element M1 is turned off, the gate node voltage DTG is Vdata-|Vth|. At this time, the voltage of the first node n is also Vdata-|Vth|. During the sampling period Tsam, the gate-source voltage Vgs of the driving element DT is |Vgs|=Vdata-(Vdata-|Vth|)=|Vth|.

During the data writing period Twr, the N$^{th}$ scan pulse SCAN(N) is inverted to the gate-off voltage VGH. The N-1$^{th}$ scan pulse SCAN(N-1) and the emission signal EM(N) maintain the gate-off voltage VGH during the data writing period Twr. Hence, during the data writing period Twr, all the switch elements M1 to M6 remains in the off state.

During the emission period Tem, the emission signal EM(N) may be generated as the gate-off voltage VGH. During the emission period Tem, to improve the low gradation expression, the emission signal EM(N) may be turned on and off at a preset duty ratio and swing between the gate-on voltage VGL and the gate-off voltage VGH. Hence, the emission signal EM(N) may be generated as the gate-on voltage VGL during at least some of the emission period Tem.

When the emission signal EM(N) is at the gate-on voltage VGL, a current flows between the ELVDD and the light emitting element OLED, so that the light emitting element OLED may emit light. During the emission period Tem, the N-1th and N$^{th}$ scan pulses SCAN(N-1) and SCAN(N) maintain the gate-off voltage VGH. During the emission period Tem, the third and fourth switch elements M3 and M4 are repeatedly turned on and off according to the voltage of the emission signal EM. When the emission signal EM(N) is at the gate-on voltage VGL, the third and fourth switch elements M3 and M4 are turned on, so that a current flows through the light emitting element OLED. Here, Vgs of the driving element DT is |Vgs|=ELVDD-(Vdata-|Vth|), and the current flowing through the light emitting element OLED is K(ELVDD-Vdata)$^2$, where K is a constant value determined according to the charge mobility, parasitic capacitance, and channel capacity of the driving element DT.

Figure 22:
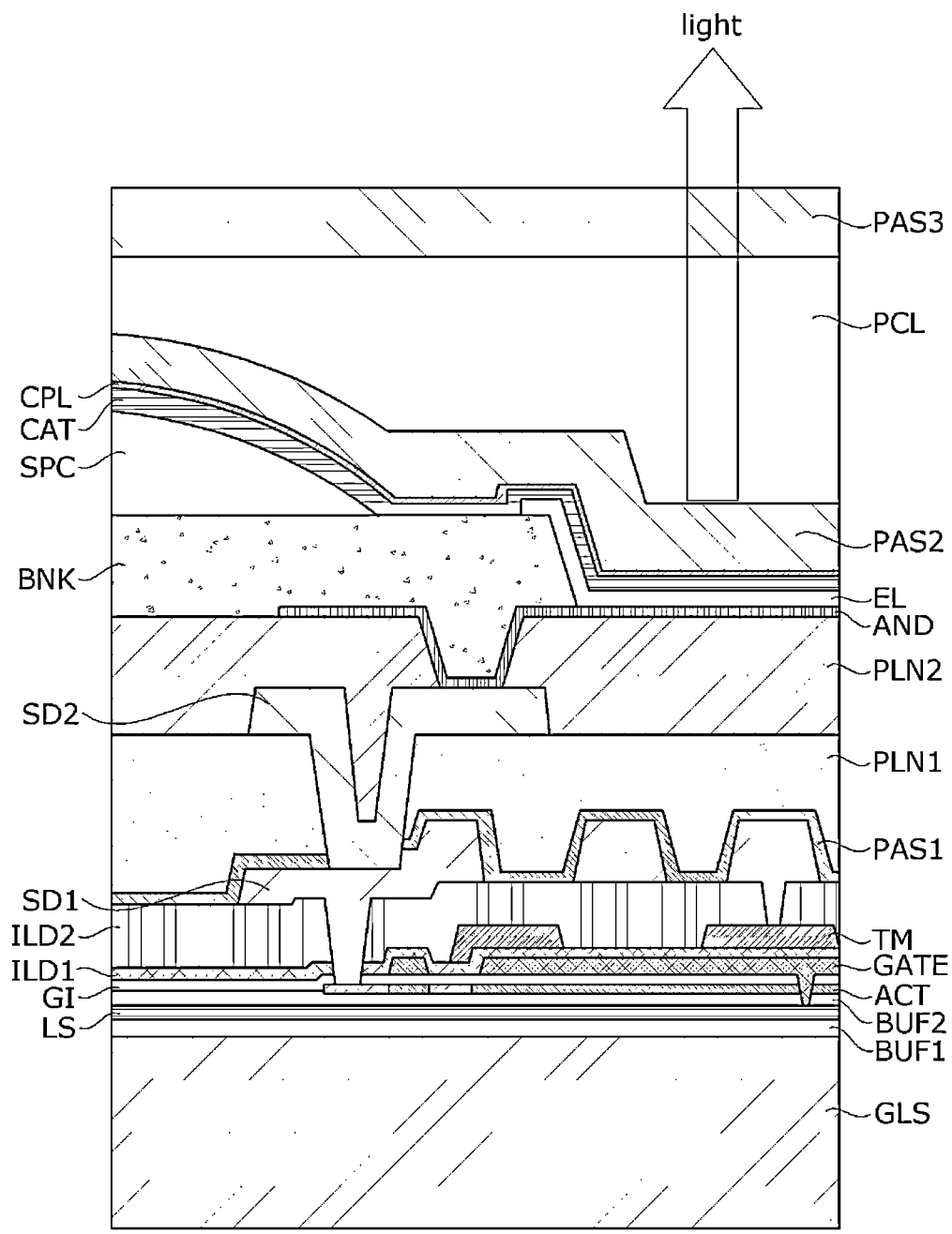
FIG. 22 is a cross-sectional view showing in detail a cross-section of a display panel according to an embodiment of the present disclosure.

FIG. 22 is a cross-sectional view showing in detail a cross-section of a display panel according to an embodiment of the present disclosure. It should be noted that the cross-sectional structure of the display panel 100 shown in FIG. 22 is only an illustration, and the present disclosure is not limited thereto.

With reference to FIG. 22, a circuit layer, a light emitting element layer, an encapsulation layer, and the like may be stacked on the glass substrate GLS as described above.

The first buffer layer BUF1 may be formed on the glass substrate GLS. A first metal layer LC may be formed on the first buffer layer BUF1, and a second buffer layer BUF2 may be formed on the first metal layer LS. Each of the first and second buffer layers BUF1 and BUF2 may be made of an inorganic insulating material and may be composed of one or more insulating layers. The first metal layer LS is disposed under the TFT and may include a metal pattern that blocks light irradiated to the semiconductor channel layer of the TFT.

An active layer ACT may be formed on the first buffer layer BUF2. The active layer ACT includes a semiconductor pattern for each of the TFTs of the pixel circuit and the TFTs of the gate driver. When the TFT is implemented with an oxide TFT, the semiconductor pattern may include indium gallium zinc oxide (IGZO).

A gate insulating film GI may be formed on the active layer ACT. The gate insulating film GI is an insulating layer made of an inorganic insulating material. A second metal layer GATE may be formed on the gate insulating film GI. The second metal layer GATE may include a gate electrode of the TFT and a gate line connected to the gate electrode.

A first interlayer insulating film ILD1 may cover the second metal layer GATE. A third metal layer TM may be formed on the first interlayer insulating film ILD1, and a second interlayer insulating film ILD2 may cover the third metal layer TM. The capacitor Cst of the pixel circuit may be formed at a portion where the second metal layer GATE, the first interlayer insulating film ILD1, and the third metal layer TM overlap. The first and second interlayer insulating films ILD1 and ILD2 may include an inorganic insulating material.

A fourth metal layer SD1 may be formed on the second interlayer insulating film ILD2, and a first inorganic insulating film PAS1 and a first planarization layer PLN1 may be stacked thereon. A fifth metal layer SD2 may be formed on the first planarization layer PLN1. A second planarization layer PLN2 may be stacked on the first planarization PLN1 to cover the fifth metal layer SD2. The fifth metal layer SD2 may be connected to the fourth metal layer SD1 through a contact hole penetrating the first planarization layer PLN1 and the first inorganic insulating film PAS1. The first and second planarization layers PLN1 and PLN2 are made of an organic insulating material that planarizes the surface.

The fourth metal layer SD1 may include the first and second electrodes of the TFT connected to the semiconductor pattern of the TFT through a contact hole penetrating the second interlayer insulating film ILD2. The data line DL and the power lines PL1 and PL2 may be implemented by patterning the fourth metal layer SD1 or the fifth metal layer SD2.

The anode electrode AND of the light emitting element OLED may be formed on the second planarization layer PLN2. The anode electrode AND may be connected to an electrode of a TFT used as a switch element or a driving element through a contact hole penetrating the second planarization layer PLN2. The anode electrode AND may be made of a transparent or translucent electrode material.

The pixel defining film BNK may cover the anode electrode AND of the light emitting element OLED. The pixel defining film BNK is formed in a pattern defining an emission region (or, opening region) through which light passes from each of the pixels to the outside. A spacer SPC may be formed on the pixel defining film BNK. The pixel defining film BNK and the spacer SPC may be integrated with the same organic insulating material. The spacer SPC secures a gap between a fine metal mask (FMM) and the anode electrode AND so that the FMM does not contact the anode electrode AND in the deposition process of an organic compound EL.

An organic compound EL is formed in the emission region of each of the pixels defined by the pixel defining film BNK. The cathode electrode CAT of the light emitting element OLED is formed on the entire surface of the display panel 100 so as to cover the pixel defining film BNK, the spacer SPC, and the organic compound EL. The cathode electrode CAT may be connected to the VSS electrode PL3 formed by any one of the lower metal layers. A capping layer CPL may cover the cathode electrode CAT. The capping layer CPL is formed of an inorganic insulating material and protects the cathode electrode CAT by blocking the penetration of air and out-gassing of an organic insulating material applied on the capping layer CPL. A second inorganic insulating film PAS2 may cover the capping layer CPL, and a planarization layer PCL may be formed on the second inorganic insulating film PAS2. The planarization layer PCL may include an organic insulating material. A third inorganic insulating film PAS3 may be formed on the planarization layer PCL.

It should be noted that the embodiments of the present disclosure can be applied independently or in combination.

Since the contents of the specification described as a problem to be solved, a problem solving means, and an effect does not specify essential features of the claims, the scope of the claims is not limited by the matters described in the contents of the specification.

What is claimed is:

1. A display panel comprising:
a first substrate on which a main display area is disposed;
at least one second substrate on which an auxiliary display area smaller than the main display area is disposed, the at least one second substrate being spaced apart from the first substrate; and
an organic film connecting the first substrate and the at least one second substrate,
wherein the at least one second substrate includes a plurality of block substrates separated from each other,
wherein the plurality of block substrates are connected by the organic film, and
wherein each of the plurality of block substrates comprises pixels of the auxiliary display area.

2. The display panel of claim 1, wherein:
the at least one second substrate comprises:
a first sub-substrate connected to a long side of the first substrate through the organic film;
a second sub-substrate connected to a short side of the first substrate through the organic film; and
a third sub-substrate connected to a corner portion where the long side and the short side of the first substrate meet, and
wherein the first sub-substrate includes a plurality of first block substrates spaced apart in a direction going away from the first substrate,
wherein the second sub-substrate includes a plurality of second block substrates spaced apart in a direction going away from the first substrate, and
wherein the third sub-substrate includes a plurality of third block substrates spaced apart in a shape of rings having a same center.

3. The display panel of claim 2, wherein the plurality of third block substrates are separated in a radial form.

4. The display panel of claim 3, wherein the organic film connects the plurality of first block substrates, the plurality of second block substrates, and the plurality of third block substrates.

5. The display panel of claim 3, wherein when the first substrate and the plurality of third block substrates are on same plane, sizes of the plurality of third block substrates increase as a distance from the first substrate increases.

6. The display panel of claim 5, wherein a number of pixels disposed on the plurality of third block substrates increases as a distance from the first substrate increases.

7. The display panel of claim 3, wherein when the first substrate and the plurality of third block substrates are on same plane, a gap between third block substrates adjacent to each other increases as a distance from the first substrate increases.

8. The display panel of claim 2, further comprising:
a driving substrate; and
a gate driving circuit disposed on the driving substrate,
wherein the driving substrate is disposed adjacent to the first sub-substrate and the third sub-substrate, and is connected to the first sub-substrate and the third sub-substrate through the organic film.

9. The display panel of claim 8, wherein:
the driving substrate comprises a first driving substrate adjacent to the first sub-substrate, and second driving substrates adjacent to the third sub-substrate; and
the first driving substrate and the second driving substrates are connected through the organic film.

10. The display panel of claim 9, wherein the second driving substrates are separated in a radial form.

11. The display panel of claim 1, further comprising first pixels disposed on the first substrate and second pixels disposed on the at least one second substrate, and wherein a pixel density of the first pixels is higher than a pixel density of the second pixels.

12. The display panel of claim 11, wherein a pixels-per-inch (PPI) of the first substrate is higher than a PPI of the at least one second substrate.

13. A display panel comprising:
a first substrate including a first region in which a main display area is disposed, and second regions in which first auxiliary display areas are disposed, and the first substrate protruding respectively from sides of the first region;
second substrates disposed between the second regions adjacent to each other and on which a second auxiliary display area is disposed, the second substrates being spaced apart from the first substrate; and an organic film connecting the first substrate and the second substrates, wherein the second substrates include a plurality of block substrates separated from each other, wherein the plurality of block substrates are connected through the organic film, wherein each of the plurality of block substrates includes pixels of the second auxiliary display area.

14. The display panel of claim 13, wherein an edge sidewall of the first substrate includes wedge-shaped tapered surfaces, and becomes thinner as the first substrate goes toward an end of the edge sidewall.

15. The display panel of claim 14, wherein the tapered surfaces are symmetrical with respect to a thickness center of the first substrate.

16. The display panel of claim 14, wherein a length of the tapered surfaces is inversely proportional to a thickness of the first substrate.

17. The display panel of claim 13, wherein the plurality of block substrates are spaced apart in a shape of rings having a same center.

18. The display panel of claim 17, wherein the plurality of block substrates are separated in a radial form.

19. The display panel of claim 13, further comprising:

a driving substrate; and a gate driving circuit disposed on the driving substrate, wherein the driving substrate includes:

a first driving substrate disposed adjacent to the first auxiliary display area of the first substrate; and a second driving substrate disposed adjacent to the second auxiliary display area of the second substrates.

20. The display panel of claim 13, wherein a pixels-per-inch (PPI) of the first substrate is higher than a PPI of the second substrates.

* * * * *